(12) United States Patent
Nagamine et al.

(10) Patent No.: US 6,926,375 B2
(45) Date of Patent: Aug. 9, 2005

(54) UNIT CONNECTING MECHANISM AND IMAGE DISPLAY DEVICE

(75) Inventors: Atsushi Nagamine, Tokyo (JP); Yuji Endo, Tokyo (JP); Etsuo Sodeno, Tokyo (JP)

(73) Assignee: Toshiba Transport Engineering Inc., Tokyo (JP)

( * ) Notice: Subject to any disclaimer, the term of this patent is extended or adjusted under 35 U.S.C. 154(b) by 268 days.

(21) Appl. No.: 10/237,737

(22) Filed: Sep. 10, 2002

(65) Prior Publication Data

US 2003/0217495 A1 Nov. 27, 2003

(30) Foreign Application Priority Data

May 24, 2002 (JP) ..................................... P2002-151125
May 24, 2002 (JP) ..................................... P2002-151135

(51) Int. Cl.[7] .............................................. F16B 12/00
(52) U.S. Cl. ........................... 312/111; 40/550; 40/605
(58) Field of Search ................................ 312/107, 108, 312/111, 257.1, 263, 198, 140; 40/447, 452, 550, 605

(56) References Cited

U.S. PATENT DOCUMENTS

| | | | |
|---|---|---|---|
| 4,433,881 A | * | 2/1984 | Witten et al. ............ 312/107.5 |
| 5,020,253 A | * | 6/1991 | Lie et al. ....................... 40/576 |
| 5,914,698 A | | 6/1999 | Nicholson et al. |
| 5,941,616 A | | 8/1999 | Billingham |

FOREIGN PATENT DOCUMENTS

| | | | |
|---|---|---|---|
| CH | 602048 | * | 7/1978 |
| JP | 08292728 | | 11/1996 |
| JP | 11265153 | | 9/1999 |
| JP | 20011350434 | | 12/2001 |

* cited by examiner

Primary Examiner—James O. Hansen
(74) Attorney, Agent, or Firm—Finnegan, Henderson, Farabow, Garrett & Dunner, L.L.P.

(57) ABSTRACT

A unit connecting mechanism and box-like unit is disclosed having an engaging unit (4) and a connecting pin (3) which are mounted to the box-like unit (1) to allow a plurality of box-like units (1,1) to be coupled to one another in a vertical direction. A handle (44) is operatively connected to a hook (43) to catch an engaging rod (3a) and is vertically raised to cause a stopper (45) to lock the hook (43) and the engaging rod (3a) in a locked condition, with operation of the handle (44) causing the stopper (45) to move downward to cause the hook disengage from the engaging rod for thereby uncoupling the box-like units (1,1) from one another. As a result, the unit connecting mechanism can be manufactured in a compact structure, providing a capability for a worker to easily and appropriately perform coupling and uncoupling operations of the box-like units.

11 Claims, 21 Drawing Sheets

PRIOR ART

PRIOR ART

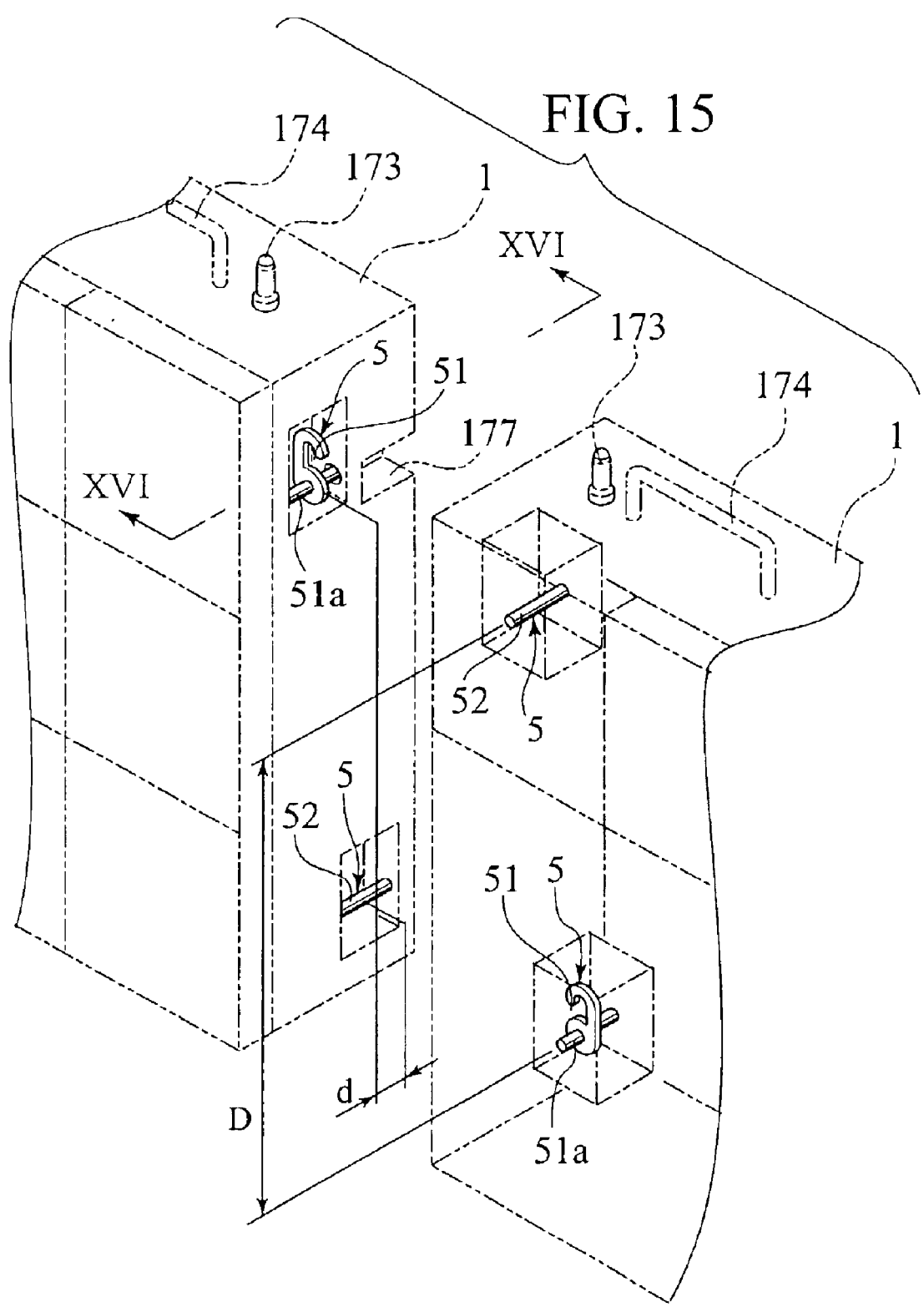

UNIT CONNECTING MECHANISM AND IMAGE DISPLAY DEVICE

BACKGROUND OF THE INVENTION

1. Field of the Invention

The present invention relates to LED display devices and, more particularly, to an image display device with a structure in which a plurality of display units, each comprised of a display panel, are arrayed in a vertical or lateral direction to provide an image in an enlarged scale, and an improvement over a unit connecting mechanism suited for connecting the plural display units to form the image display device.

2. Description of the Related Art

Image display devices of a large screen each including a display panel composed of a large number of display elements, such as LEDs (Light Emitting Diodes), which are disposed in a matrix form are mounted on outer walls (building boards) of buildings located in indoor or outdoor gymnasiums, a variety of event sites or business quarters. These image display devices are structured to be operative to provide displays of advertisements or guidance, or displays of television images using controls of turning on or turning off "R" (Red), "G" (Green) and "B" (Blue) to provide so-called full color displays.

In state-of-the-art, it has been a usual practice to structure the image display device of such a large screen with the use of large number of flat box-like units, each including a plurality of preliminarily assembled display panels, which are connected in a vertical and lateral direction to form an assembled structure, which in turn is mounted to a structure such as a building to be fixedly used at such a site for a long period of terms or to a bed of a large size vehicle to be used in a mobile form.

Since the image display device of the related art includes the large number of display units arrayed in the vertical and lateral direction in a connected relationship, there are many instances in which the display device is usually carried to an installation site in a form of disassembled display units, which are then assembled into a final structure at that site to be used and, after the use of the image display device has been terminated, the image display device is disassembled again into the individual display units which are in turn carried to another event site.

FIGS. 1 and 2 show outer appearances of the image display device of the related art stated above, with FIG. 1 being a partially exploded view of a box-like unit 1 and FIG. 2 being a perspective view of the display unit as viewed from a rear side.

The box-like unit 1 is comprised of a front panel 12, having a plurality (shown in six pieces in FIGS. 1 and 2) of display panels 11 formed in rows and columns, which is fixed to a rear panel 14 by means of a plurality of struts. Each display panel 11 includes a large number of display elements 11a, such as LEDs, which are regularly arrayed in a matrix form. An auxiliary strut 13a, that also serves as a reinforcing member, extends between the right and left struts 13, 13 at intermediate areas thereof and is fixed thereto.

Further, fitted below the lower most struts 13, 13 and between the front panel 12 and the rear panel 14 are leg members 15, 15 that play roles as interconnecting members to enable other display units 1 to be coupled.

As shown in FIG. 2, the rear panel 14 is comprised of a chassis 141 and an openable door 142 mounted to the chassis 141, with a control unit 16 for controlling the display elements 11a being mounted to an inner side of the door 142.

As shown in cross section in FIG. 3, the strut 13 has a structure shaped in a rectangular configuration with cavity portions 131 formed at four corners. Also, FIG. 3 shows a situation in which the strut 13 is connected to the leg member 15.

As shown in FIGS. 1 and 2, further, the strut 13, the auxiliary strut 13a and the leg member 15 are formed with connecting members 2, respectively, that serve as interconnecting members to allow the other box-like units 1 to be coupled in the vertical and lateral direction.

The connecting member 2 is comprised of a movable segment 21 and an engagement segment 22 which are located in a pair, with a so-called unit connecting mechanism having a connecting capability of interconnecting adjacent box-like units 1 to be disposed in the vertical and lateral direction. As shown in FIGS. 1 and 2, one of the box-like units 1 to be interconnected is formed with either the movable segment 21 or the engagement segment 22 to allow the one display unit 1 to be connected to or disconnected from the other box-like unit 1.

FIG. 4 is an enlarged right side view of an essential part under a condition in which upper and lower box-like units 1, 1 are connected to one another with the connecting member 2 employing a so-called twisting operation mechanism. The strut 13 of the lower box-like unit 1 is mounted with the movable segment 21, and the leg member 15 of the upper box-like unit 1 is mounted with the engagement segment 22, with engagement operation of these segments compelling the upper and lower display units to be coupled to one another.

Now, the operation of coupling and uncoupling of the connecting member 2 is described below with reference to FIGS. 5A and 5B which are views as viewed in an arrow V-V in FIG. 4. As shown in FIG. 5A, the connecting member 2 is structured such that rotating a grip 211 of the movable member 21 in a direction as shown by an arrow R causes a hook portion 212 to protrude or retract in a direction as shown by an arrow Y.

Thus, as shown in FIG. 5B, rotating the grip 211 of the movable segment 21, remaining in a closed position, in the direction as shown by the arrow R causes the hook portion 212 to be lowered in a direction as shown by an arrow Y1 to capture and pull an annular engagement segment 22 of the upper display unit 1, rendering the upper and lower box-like units 1, 1 to be brought into a coupled condition.

Also, the grip 211 of the movable segment 21 has a structure that can be folded with the engagement segment 22 held in a pulled condition. For this reason, as shown in FIG. 4, the connecting member 2 is brought into locked condition. Also, the connecting member 2 is brought into an uncoupled condition by moving the grip 211 in a reverse direction.

Although the upper and lower box-like units 1, 1 have been described above to form an assembled structure, the right and left box-like units 1, 1 may also be coupled to one another via the connecting member 2 in the same manner as set forth above. As shown in FIGS. 1 and 2, the connecting member 2 disposed between the lateral right and left box-like units 1, 1 has the same structure as that of the connecting member 2 disposed between the upper and lower box-like units 1, 1. Using the connecting members 2 in the vertical direction and the lateral direction enables the plural box-like units 1, 1 to be coupled into an assembled structure in an expanded condition in the vertical and lateral direction as viewed in FIG. 6.

Also, in order to couple the plural box-like units 1, 1 to one another, there are some instances in which through holes are formed in the respective struts 13, 13 to allow bolts to be inserted through the through holes of the struts 13, 13 of the respective box-like units 1, 1 to cause the bolts to be tightened without relaying on the coupling or uncoupling operations of the connecting members 2, 2 extending between the adjacent box-like units 1, 1.

With the image display device of such a related art set forth above, attempts have been made to cause the connecting member to extend between respective struts, the auxiliary struts or the leg members of the adjacent display units to be fixedly mounted, or other attempts have been made to fixedly couple the struts pre se of the adjacent display units by means of fixture bolts.

SUMMARY OF THE INVENTION

However, the unit connecting mechanism of the related art suffers from inconvenient work to be needed for a worker to carry out connection or disconnection of the display units by opening the doors of the display units and inserting his hand into a narrow area inside each of the display units to manipulate the connecting members each time the box-like units 1, 1 are assembled or disassembled. Accordingly, the worker suffers from troublesome and back breaking work and, thus, an improvement over the related art structure is required.

Especially, there are many instances where the image display device of a high resolution type comprised with LEDs includes an assembled structure comprised of a large number of display units, interconnected to one another, resulting in a weight over 30 Kg. Thus, under a condition where the image display device should be moved to various sites with an accompanied repeated frequency of assembling or disassembling works, there is a need for addressing an issue of how safely and how efficiently the worker is able to perform the assembling (coupling) and disassembling (uncoupling) operations of the plural display units.

Therefore, it is an object of the present invention to provide an image display device which is able to realize a compact structure that employs a unit connecting mechanism enabled to easily and properly perform assembling and disassembling operations of adjacent display units while enhancing an increased safety for a worker who performs the assembling and disassembling operations.

To address the above issue, according to a first aspect of the present invention, there is provided a unit connecting mechanism adapted to be mounted between plural box-like units to cause the plural box-like units to be coupled to and uncoupled from one another, the unit connecting mechanism comprising: a first coupling member operative to couple the box-like units in a vertical direction; and two sets of second coupling members disposed at side walls of the box-like units at inward areas thereof, respectively, to cause the box-like units to be coupled in a lateral direction; wherein the first coupling member includes a connecting pin standing upright from an upper end of lower one of the box-like units and having an engaging rod laterally extending from the connecting pin, a hook portion mounted in a lower area of lower one of the box-like units and supported on a laterally extending shaft for rotational movement, a grip portion operatively connected to the hook portion and operative to rotate upward to cause the hook portion to catch the engaging rod to which the hook portion comes closer, and an engaging section including a stopper operative to lock the grip portion, which rotates upward, and to release the grip portion due to downward operation thereof; and wherein the second coupling members are disposed on the side walls of the box-like units to be separated from one another in a vertical direction and in a rearward direction and each has an operating point exposed to a rear side of the box-like unit to allow the second coupling member to be operated in a coupled condition or an uncoupled condition.

Further, a second aspect of the present invention relates to box-like unit adapted to be coupled to or uncoupled from one another, the box-like unit comprising: a chassis having an upper end portion and a bottom end portion; a connecting pin standing upright from the upper end portion of the chassis and having an engaging rod laterally extending from the connecting pin; and an engaging section mounted inside the chassis at a lower area thereof and operative to move within the chassis to engage or disengage from another engaging rod of another connecting pin standing upright from another box-like unit to allow the plural box-like units to be coupled to or uncoupled from one another in a vertical direction.

BRIEF DESCRIPTION OF THE DRAWINGS

FIG. 15 is a perspective view of the unit connecting mechanism operative to couple the right and left box-like units shown in FIGS. 7 and 8.

DESCRIPTION OF THE EMBODIMENT

Figure 1:
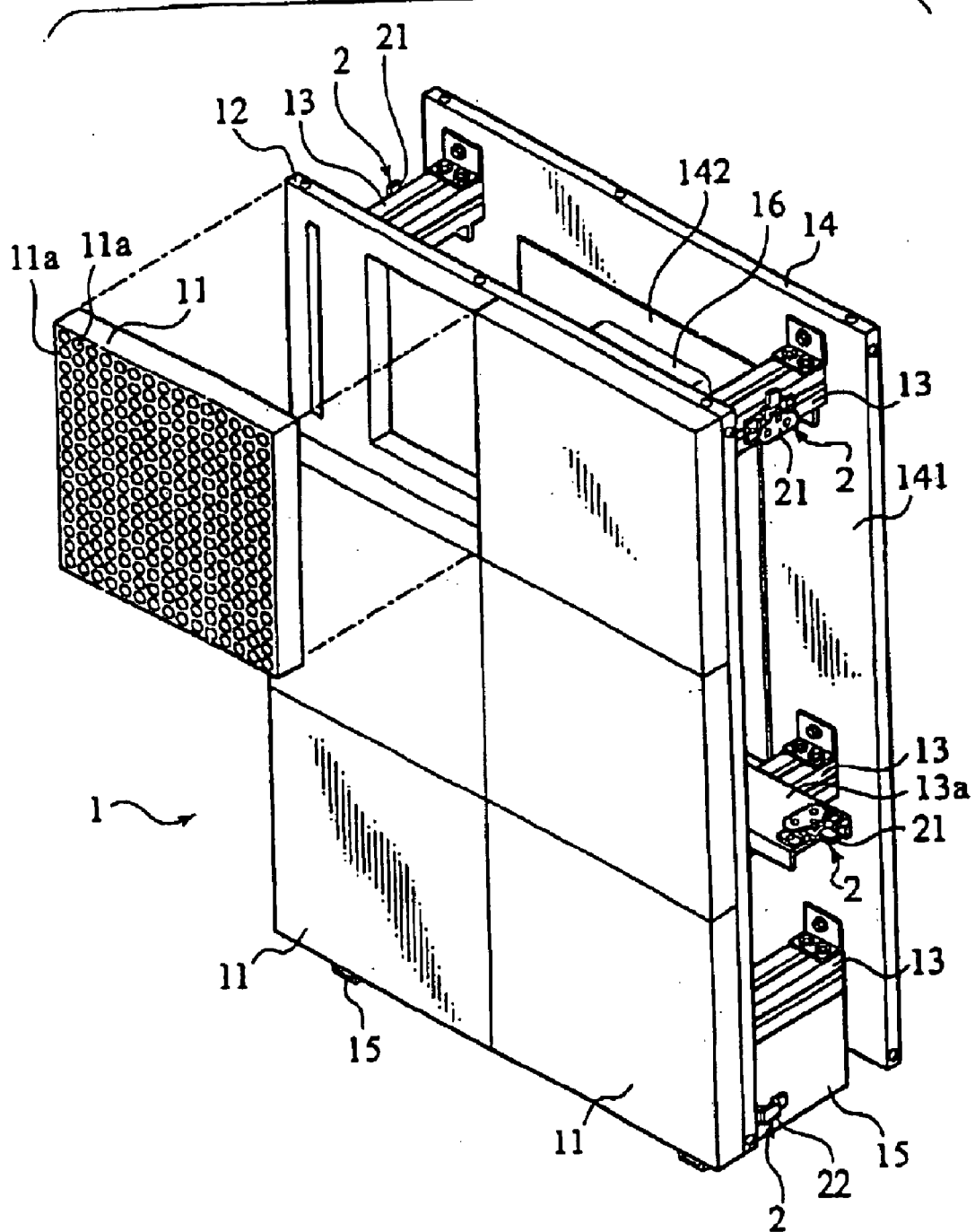
FIG. 1 is a perspective view of a box-like unit forming an image display unit of a related art.
Figure 2:
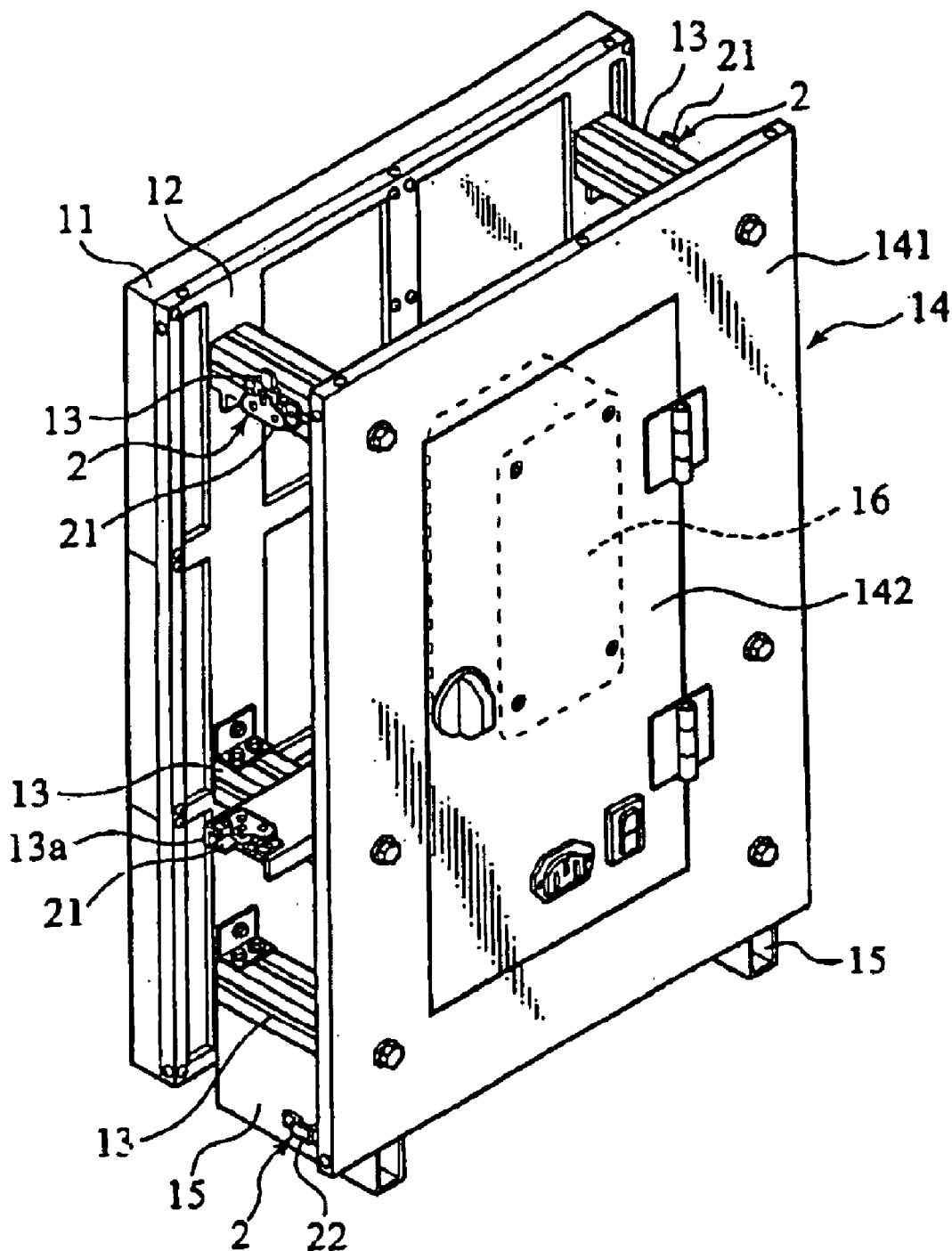
FIG. 2 is a perspective view of the unit as viewed from a rear side of the unit shown in FIG. 1.
Figure 3:
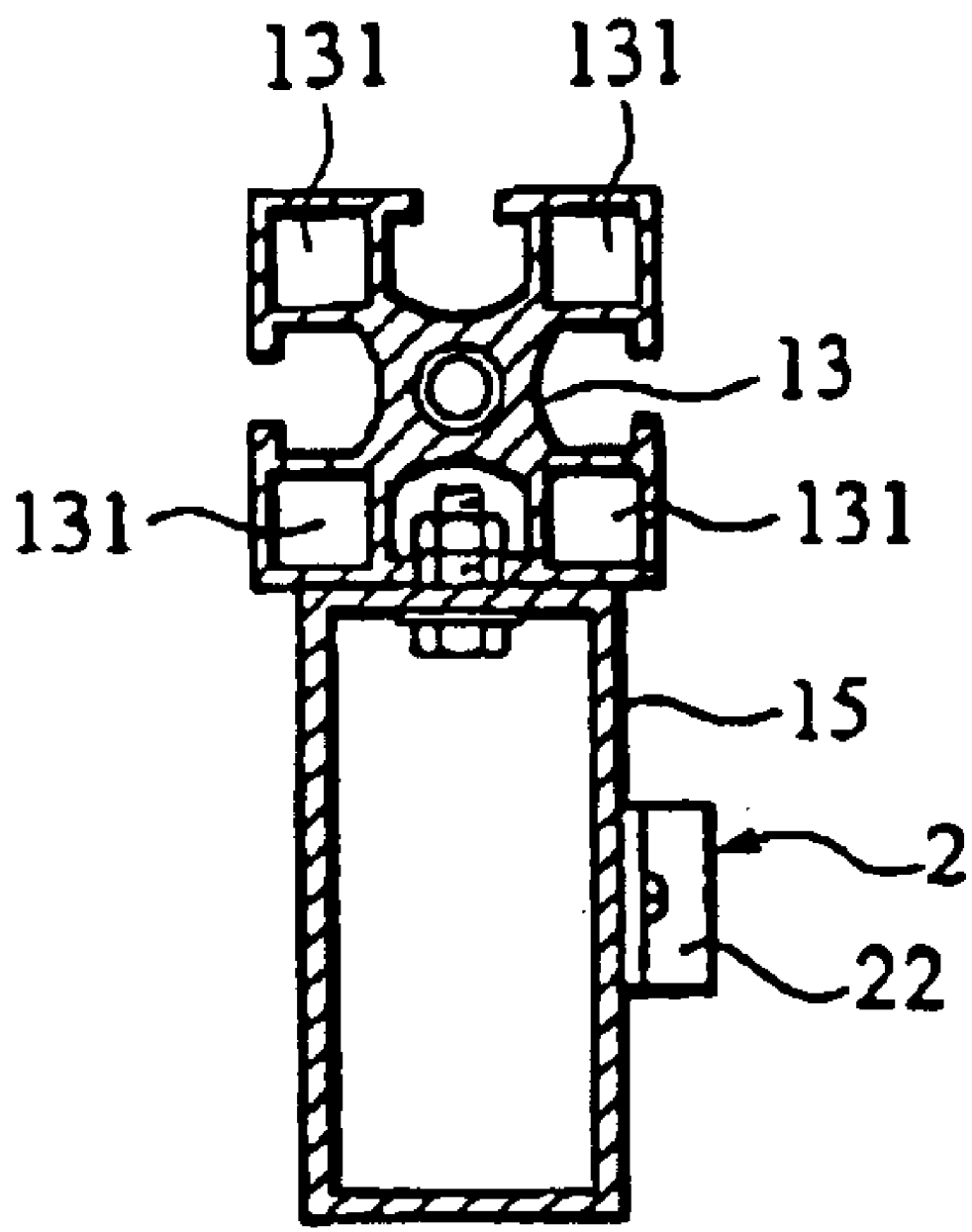
FIG. 3 is a cross sectional view illustrating a connecting status between a strut and a leg member shown in FIG. 1.
Figure 4:
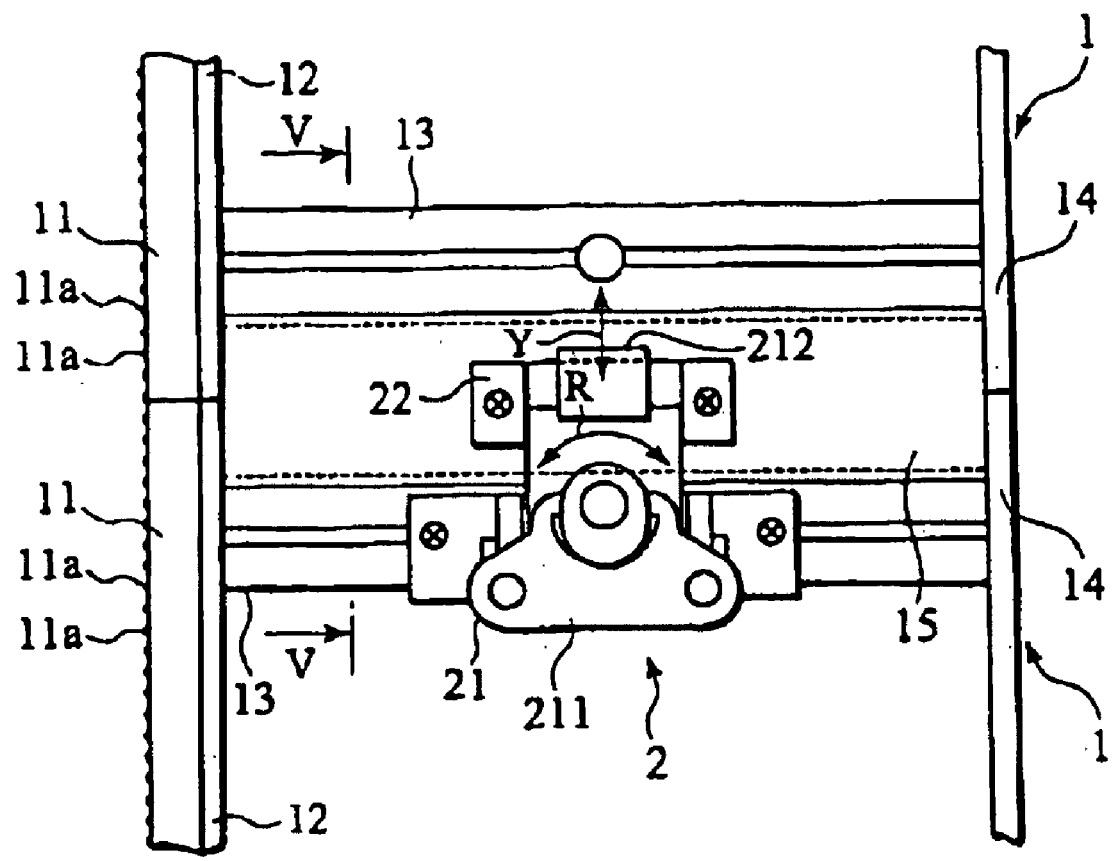
FIG. 4 is a cutaway side view illustrating upper and lower box-like units remaining in a coupled condition via a unit connecting mechanism.
Figure 5A:
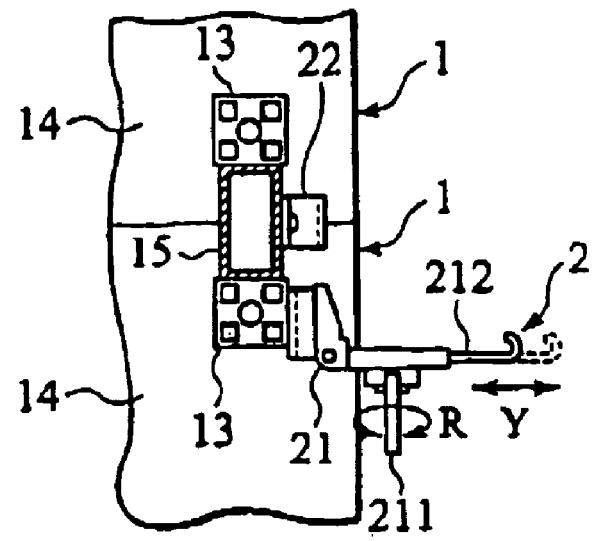
FIGS. 5A and 5B are views illustrating operation of the unit connecting mechanism shown in FIG. 4
Figure 5B:
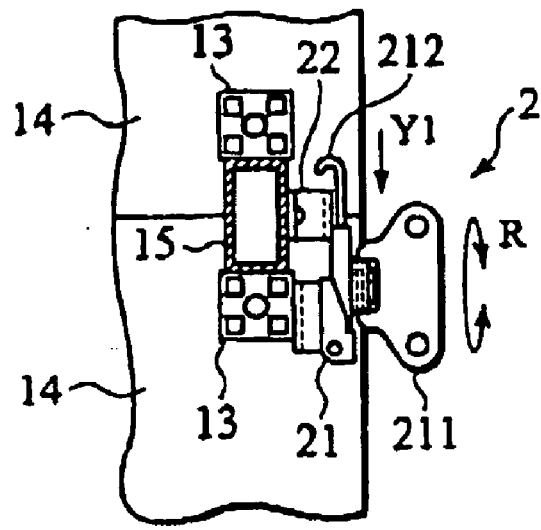
Figure 6:
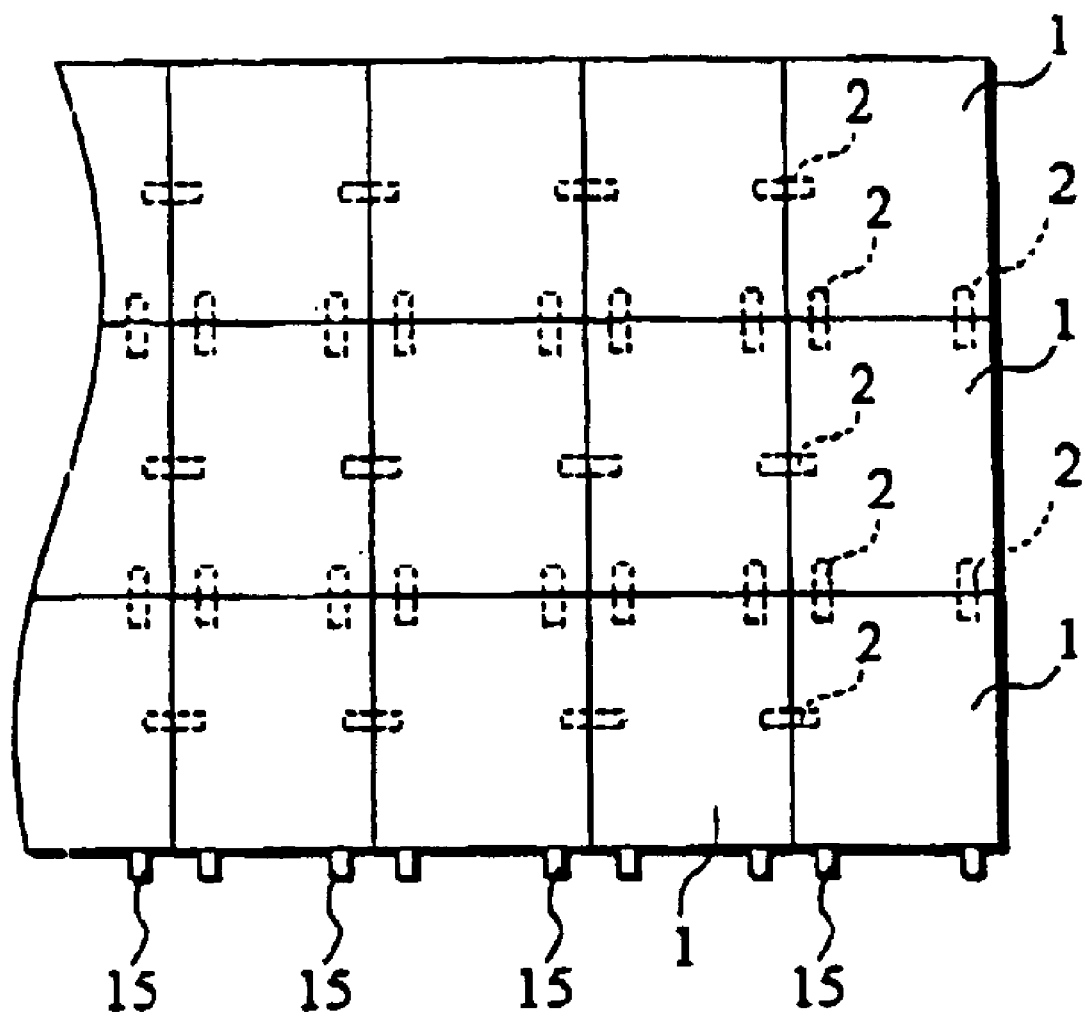
FIG. 6 is a front view of the image display device formed of the coupled box-like units sown in FIG. 1.

A unit connecting mechanism and an image display device of an embodiment of the present invention employing the unit connecting mechanism are described with reference to FIGS. 7 to 18, with like parts bearing the same reference numerals as those shown in FIGS. 1 to 5 to omit a redundant description.

First Embodiment

Figure 7:
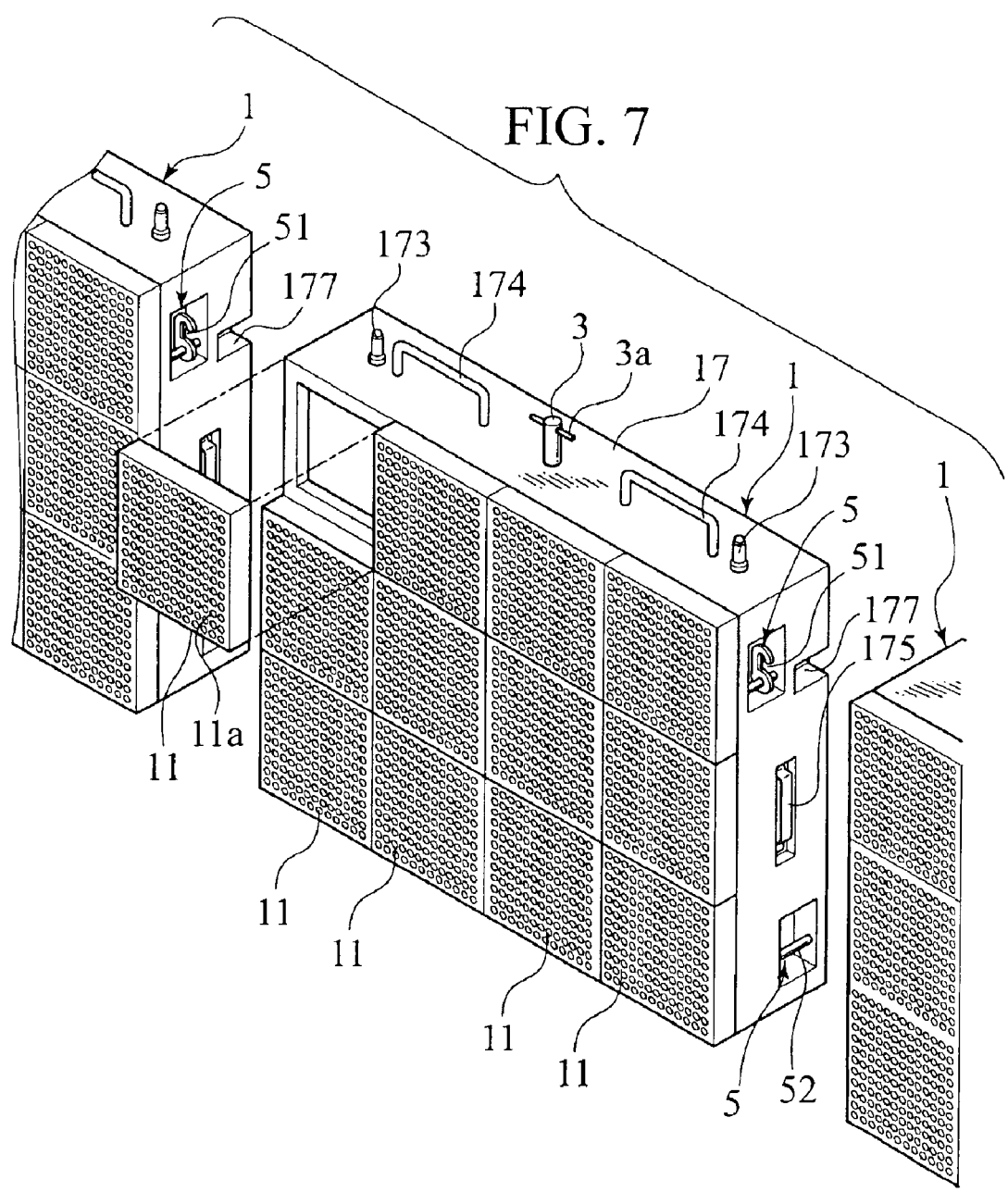
FIG. 7 is a perspective view of an image display device composed of plural box-like units each incorporating a unit connecting mechanism of a first embodiment according to the present invention.
Figure 8:
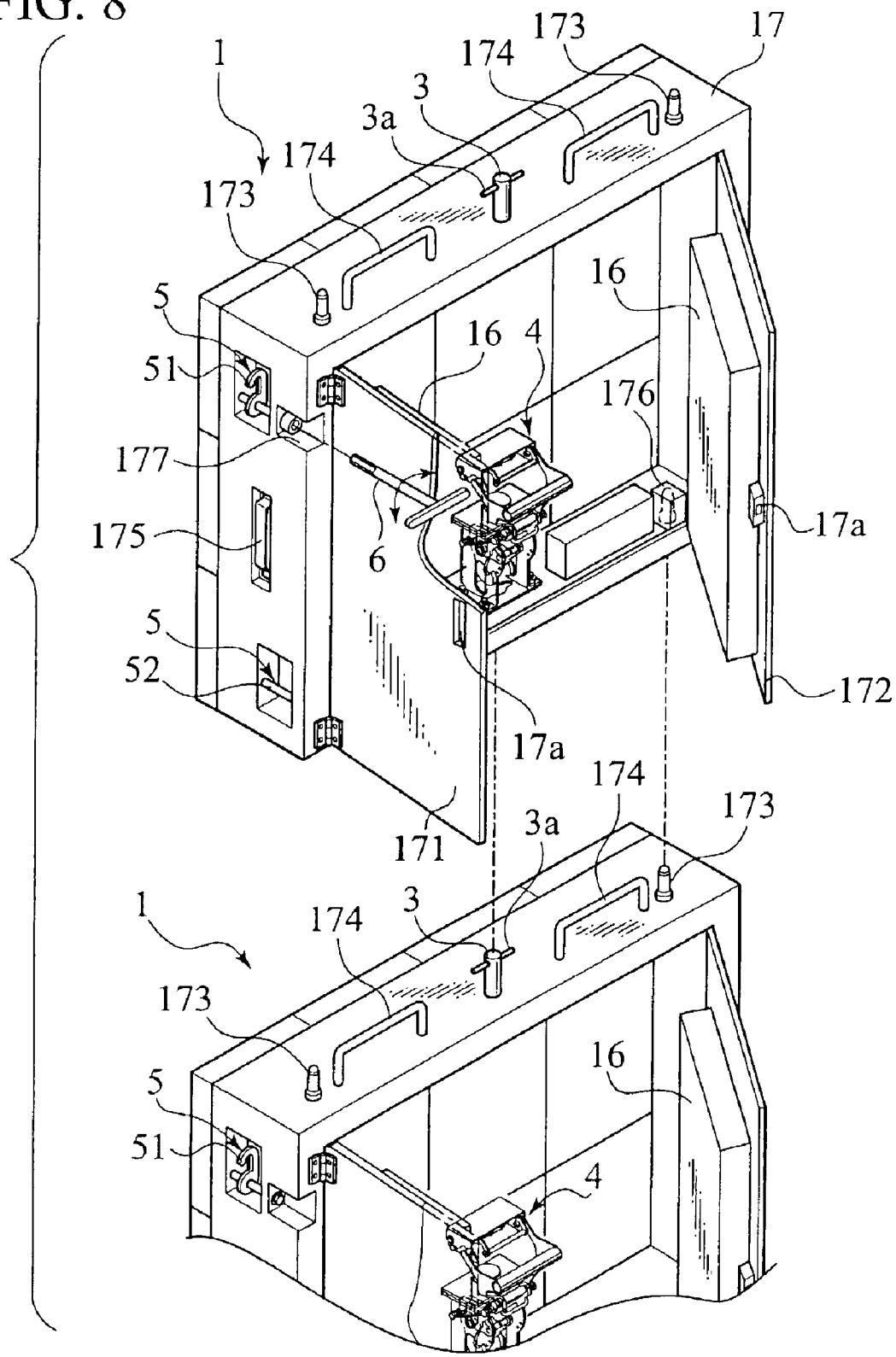
FIG. 8 is a perspective view of upper and lower box-like units as viewed from a rear side of the box-like unit shown in FIG. 7.

FIG. 7 is a perspective view of a box-like unit of a first embodiment forming an image display device according to the present invention, and FIG. 8 is a perspective view of the display unit as viewed from a rear side.

As shown in FIG. 7, the box-like unit 1 of the embodiment according to the present invention includes a plurality (shown as twelve pieces in this embodiment) of display panels 11, each comprised of a large number of display elements 11a such as LEDs, which are assembled on a flat box-like chassis 17. Also, as shown in FIG. 8, mounted at a rear side of the chassis 17 are double-hinged doors 171, 172, with a control unit 16 being fixedly mounted to an inner wall of the chassis 17 for controlling drive states of the display elements 11a. Also, reference numeral 17a designate grip portions with respective lock mechanisms disposed at the double-hinged doors 171, 172.

A connecting pin 3 stands upright at a center of an upper surface of the chassis 17 and, likewise, a pair of guide pins 173, 173 stand upright at right and left sides on the upper surface of the chassis 17.

The connecting pin 3 has a bar-shaped engaging rod 3a that laterally extends through the connecting pin 3 and is fixed thereto for forming a T-shaped configuration to allow the connecting pin 3 and the bar-shaped engaging rod 3a to engage an associated engaging section 4 of another box-like unit 1 to be upwardly stacked such that the upper and lower box-like units 1, 1 are connected to one another in the vertical direction. Thus, the connecting pin 3 and the engaging rod 3a serves as a first coupling member to couple the upper and lower box-like units 1, 1 to be coupled to or uncoupled from one another. Also, the pair of guide pins 173, 173 serves as positioning members to position the associated upper and lower box-like units 1, 1 at a fixed place in the vertical direction.

Handholds 174, 174 are fixedly mounted to the chassis 17 at positions between the connecting pin 3 and the guide pins 173, 173 to allow the worker to carry the box-like unit 1. The handholds 174, 174 may also be roped to allow the box-like unit 1 to be lifted up with a crane. Further, also disposed at right and left side walls of the chassis 17 are handholds (disposed in concave portions) 175 with which the worker may conveniently carry the display unit 1.

Figure 9A:
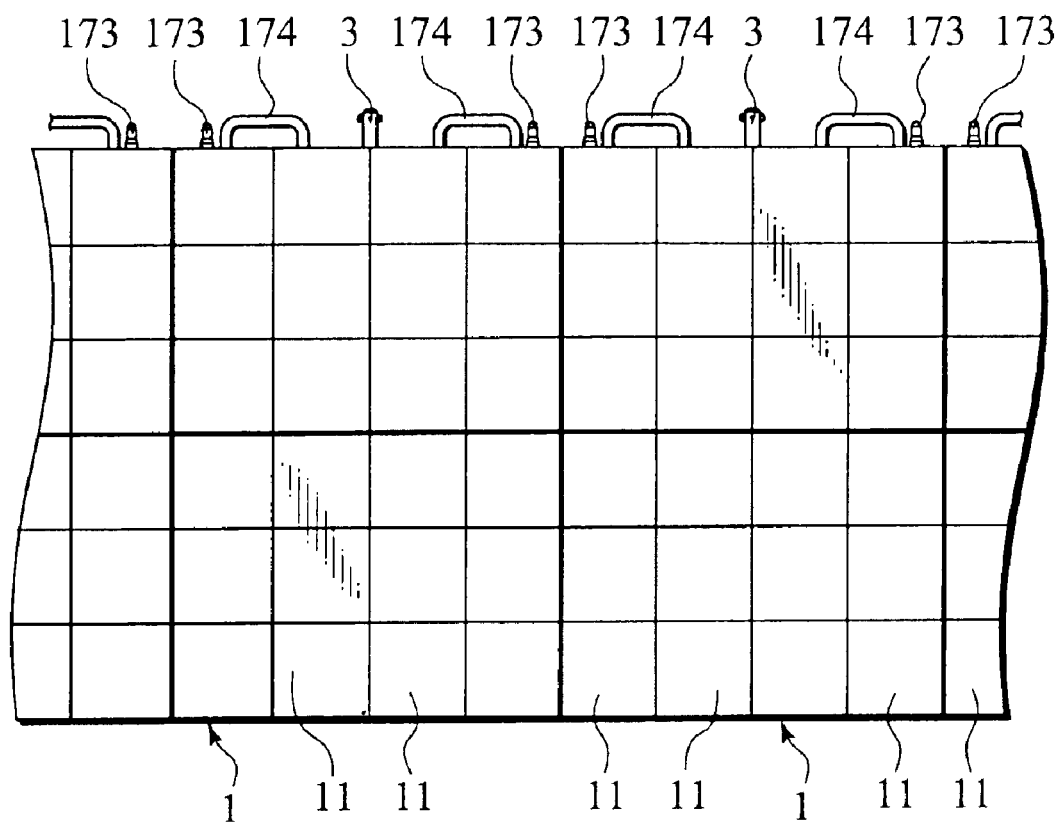
FIG. 9A is a partial front view of the image display device shown in FIG. 7.

With such a structure set forth above, the box-like units 1, 1 may be coupled in the vertical and lateral direction to form a large size display screen as shown in a front view of FIG. 9A.

Figure 9B:
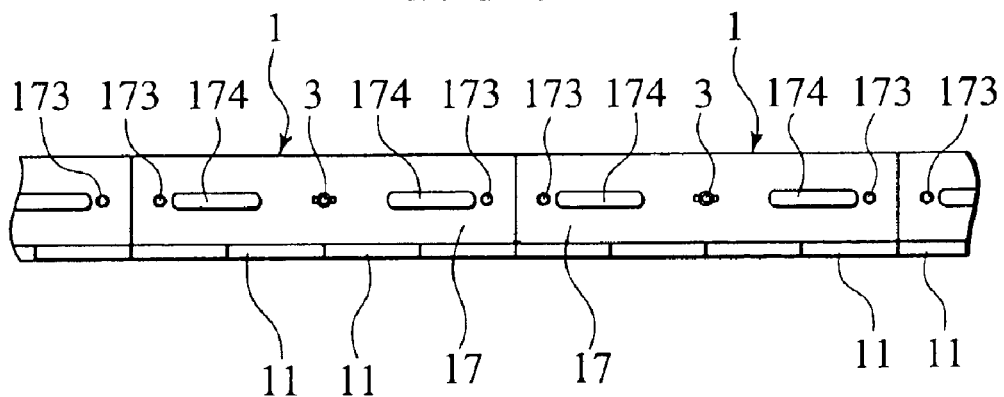
FIG. 9B is a plan view of the image display device shown in FIG. 7.

In order for the upper and lower box-like units 1, 1 to be properly coupled to one another to form a display screen even at a small joint area, the upper box-like unit 1 has a bottom face formed with recessed portions to accommodate the connecting pin 3, the guide pins 173, 173 and handholds 174, 174 of the lower box-like unit 1. Also, FIG. 9B is a plan view of the image display device shown in FIG. 9A.

Also, when assembling and disassembling the image display device, there are some instances where, in view of a working efficiency of assembling and disassembling works, the plural box-like units 1, 1 are preliminarily coupled to one another in the vertical direction with a resulting subassembly of the plural display units being hanged up once by the crane. To this end, the connecting pin 3, serving as a connecting means between the upper and lower box-like units 1, 1 in the vertical direction, and the associated engaging section 4 to catch the connecting pin 3 are firmly and fixedly connected to one another, and a lock mechanism is employed which prevents these components parts from being inadvertently disconnected from one another.

Figure 10:
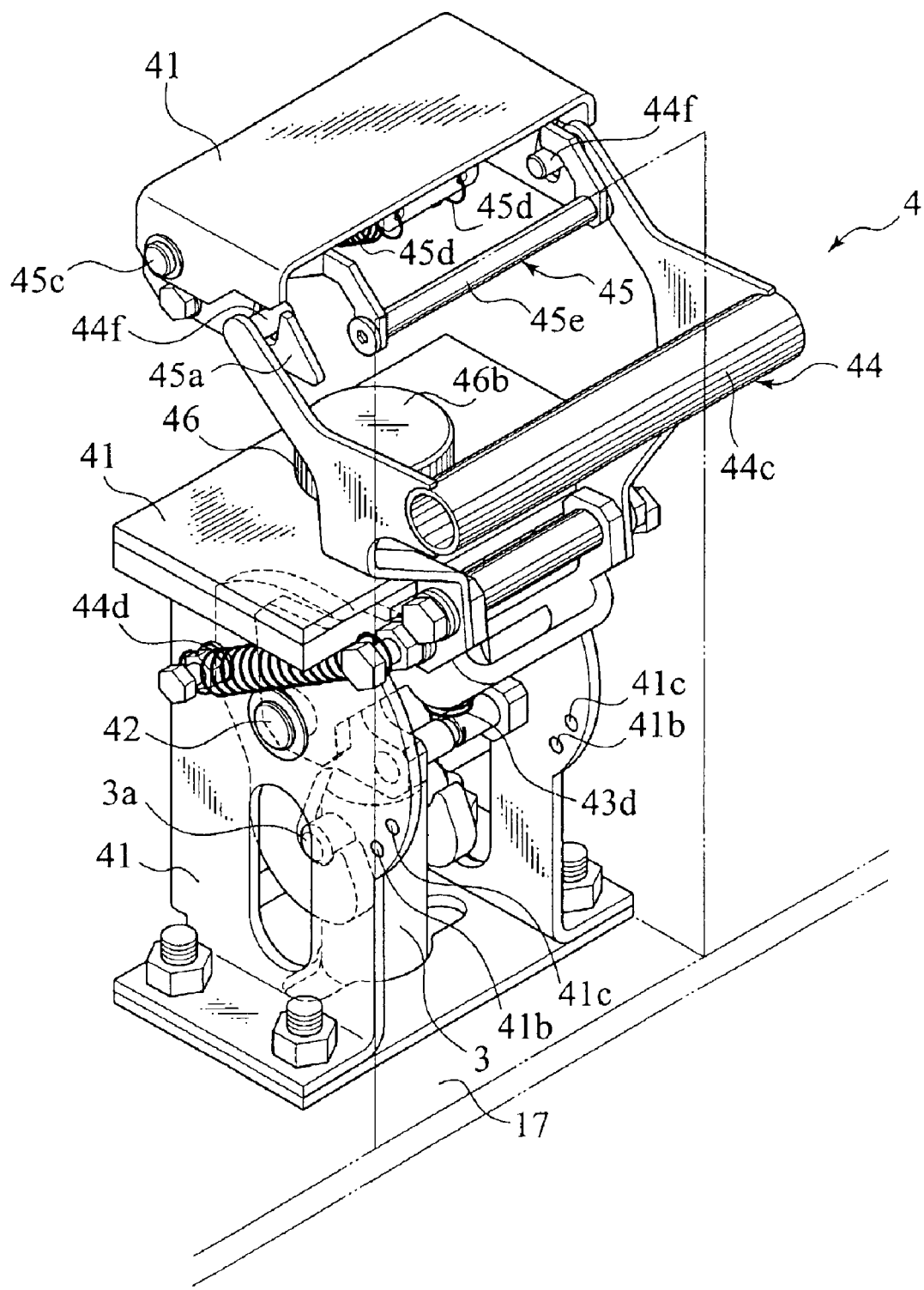
FIG. 10 is an enlarged perspective view of a unit connecting mechanism adapted to couple the box-like units, in upper and lower positions, shown in FIG. 7.
Figure 11:
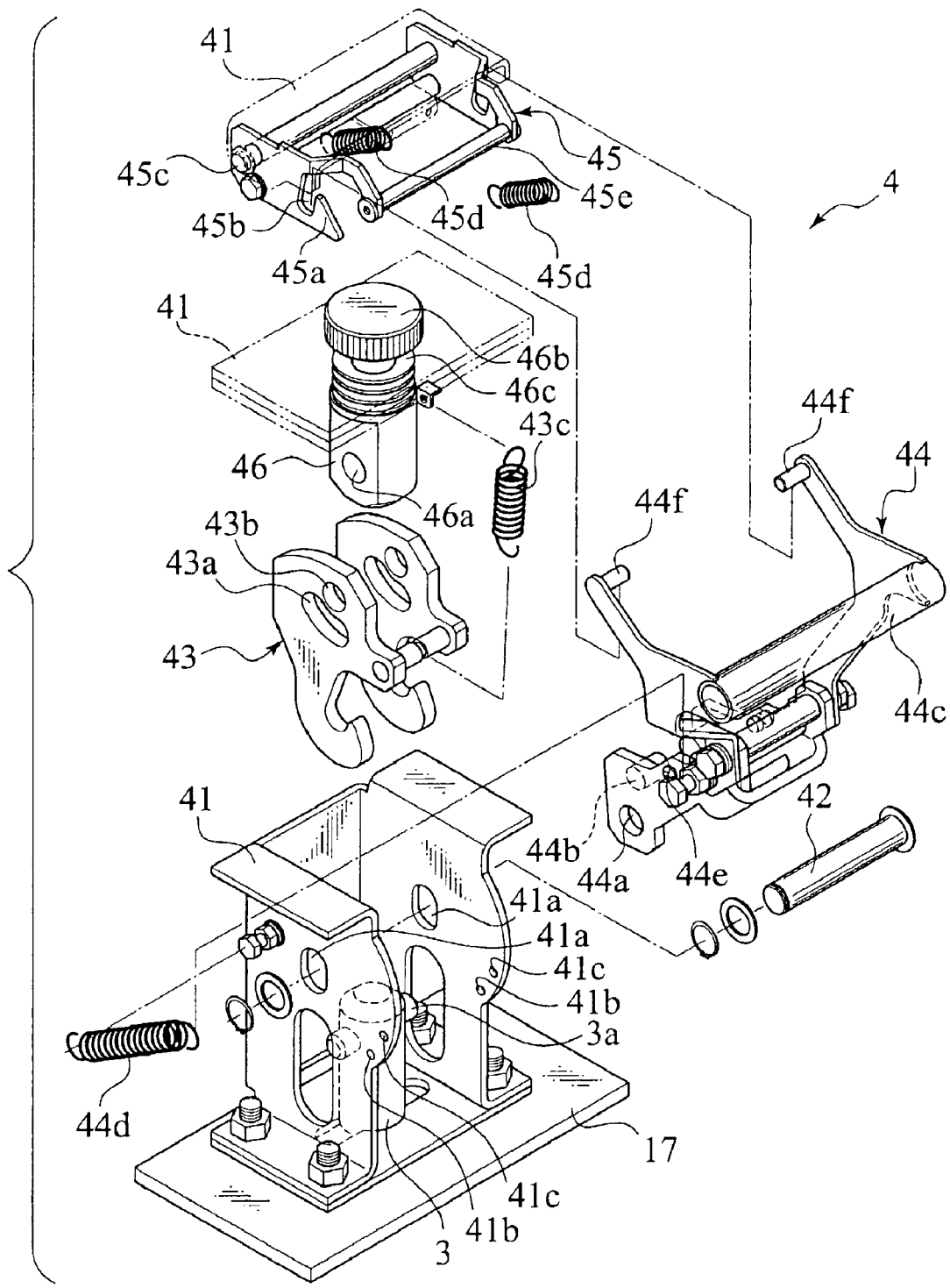
FIG. 11 is an exploded perspective view of the unit connecting mechanism shown in FIG. 10.
Figure 12:
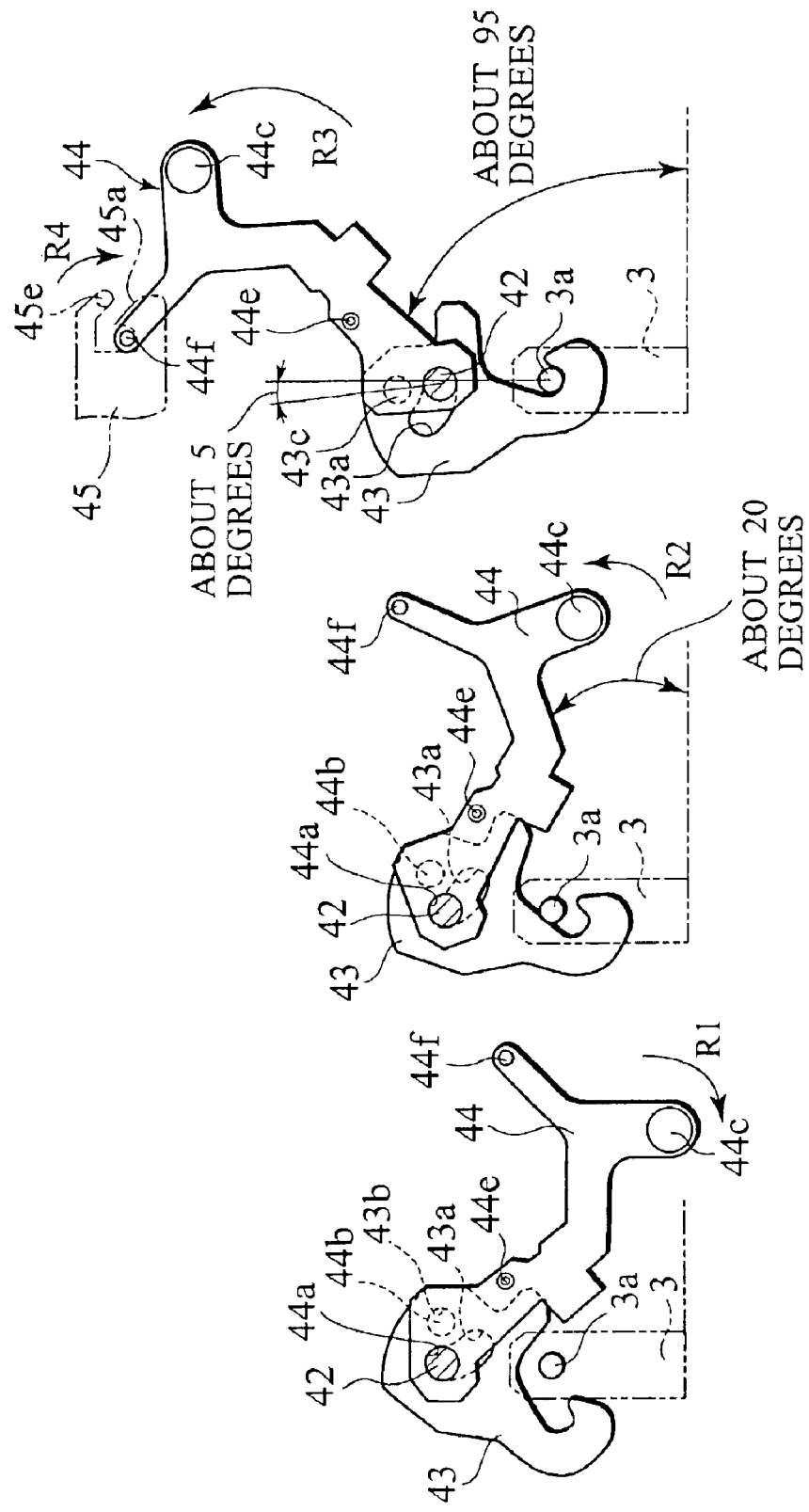
FIGS. 12A to 12C are views for illustrating operations of the unit connecting mechanism shown in FIG. 7.

FIG. 10 is a perspective view illustrating the unit connection mechanism remaining in a locked condition wherein, under a coupled condition of the upper and lower box-like units 1, 1, the lower connecting pin 3 is held in engagement with the upper engaging section 4, and FIG. 11 is an exploded perspective view of the unit connecting mechanism.

As shown in FIGS. 10 and 11, the engaging section 4 of the upper box-like unit 1 is comprised of a body frame 41 fixed to the chassis 17 of the box-like unit 1, a hook 43 connected to the body frame 41 via a fixing pin 42 freely inserted through operating apertures 41a of the body frame 41 and having a pair of hook portions, a handle 44 coupled to the hook 43 and having a grip portion, and a stopper 45 adapted to catch and lock the handle 44 during the coupling operation and to enable the handle 44 to be released from the locked condition.

Further, the fixing pin 42 is fixedly connected to an adjustor 46 with which a height position of the fixing pin 42 can be adjusted and which is mounted to the body frame 41. That is, the fixing pin 42 is inserted through a bore 46a of the adjustor 46 and arranged to be vertically movable within the operating apertures 41a, 41a which are elongated in the vertical direction.

Furthermore, the handle 44 and the hook 43 are coupled to one another under a situation in which the fixing pin 42 inserted through a retaining bore 44a of the handle 44 extends through guide bores 43a formed in the hook 43 in curved elongated slots, with a pin 44b disposed on the handle 44 engaging a bore 43b of the hook 43 for free rotational movement.

The engaging section 4 performs the coupling operations in a sequence of: (i) a first operation of receiving the connecting pin 3 of the lower box-like unit 1; (ii) a second operation of catching the connecting pin 3; and (iii) a third operation of fixing the caught connecting pin 3. The uncoupling operations of the upper and lower box-like units 1, 1, that are coupled to one another via the engaging section 4, may be performed in a reversed order of: (i) a first operation of releasing the connecting pin 3 from its locked position; (ii) a second operation of releasing the connecting pin 3 from the coupled position; and (iii) a third operation of removing the connecting pin 3 from the associated box-like unit 1.

Also, upon height adjustment of the fixing pin 42 due to the adjustor 46, as will be described below in detail, a distance between the upper and lower box-like units 1, 1 can be finely adjusted with the upper and lower box-like units 1, 1 being held in the coupled condition. That is, under a situation where the upper box-like unit 1 is placed on the lower box-like unit 1, the worker is able to smoothly operate the handle 44 to couple the upper and lower box-like units 1, 1 with respect to one another and to achieve the height adjustment of the fixed pin 3 such that, when the upper and lower box-like units 1, 1 remain in the coupled state, an appropriate joint portion between the upper and lower box-like units 1, 1, i.e., a favorable joint in the display screen can be obtained.

Now, the coupling operations of the first to third operations (i) to (iii) of the engaging section 4 shown in FIGS. 10 and 11 are described below in detail with reference to FIGS. 12A to 12C and FIG. 13 in addition to FIGS. 10 and 11.

As previously noted above, the fixing pin 42 is inserted through the operating apertures 41a, 41a of the body frame 41 with the vertically movable capability, while the hook 43 is formed with the guide bores 43a, 43a to guide the fixing pin 42. And, the pin 44b of the handle 44 engages a bore 43b of the hook 43.

Consequently, rotational operation of the handle 44 about a center of the fixing pin 42 causes the hook 43 to be rotated to accommodate, catch and grip the engaging rod 3a in a fixed place.

That is, FIGS. 12A to 12C are illustrative views corresponding to the sequential operations (i), (ii) and (iii) described above.

First, the worker grips the grip portion 44c of the handle 44 and operates the handle 44 in a direction as shown by an arrow R1 as shown in FIG. 12A, opening the hook 43 downward in the coupling operation (i) to receive the engaging rod 3a of the lower box-like unit 1.

Also, as shown in FIG. 11, a spring 43a is suspended between the hook 43 and the body frame 41 and, in a situation shown in FIG. 12A, a force is acting on the hook 43 to cause the same to be rotated in a direction (counterclockwise direction) opposite to the arrow R1 at all times.

However, simultaneously, suspended between the handle 44 and the body frame 41 as shown in FIGS. 10 and 11 is a tension spring 44d extending across the fixing pin 42. Further, disposed at a surface of the handle 44 facing the body frame 41 is provided with a projection 44e that slides along a surface of the body frame 41 until the projection 44e is brought into engagement with a first concave portion 41b, fixed to a sliding surface of the body frame 41, as shown in FIG. 12A. For this reason, the handle 44 is configured to remain in such a stable position. Accordingly, even in a provability in that the worker temporarily release the handle 44 in the course of the series of operations, the handle 44 per se is prevented from suffering independent rotational movement due to a sliding resistance, with a resultant further safety being assured in the coupling or uncoupling operations.

In such a way, under the condition shown in FIG. 12A, the position of the hook 43 is stabled and enabled to receive the engaging rod 3a laterally extending from the connecting pin 3 without any trouble.

Subsequently, as shown in FIG. 12B, the worker grips the grip portion 44c of the handle 44 and rotates the handle 44 in a direction as shown by an arrow R2 by an angle of approximately 20 degrees against the force of the spring 44d. Under such a condition, the projection 44e of the handle 44 is brought into engagement with a second concave portion 41c of the body frame 41 in a stabled condition.

Under such a condition, as shown in FIG. 12B, the engaging rod 3a is held in contact with the hook 43 and remains stabled. Consequently, under this condition, even when the handle 44 undergoes irregular outer forces, the handle 44 is retained in the position shown in FIG. 12B.

Also, as will be mentioned below, under a situation where the hook 43 retains the lower display unit as shown in FIG. 12C, the fixing pin 42 engages the rightmost distal end of the guide bore 43a to exert a force to cause the hook 43 to be rotated in the direction as shown by the arrow R2. As a consequence, there is no probability in that the engaging rod 3a disengages from the hook 43. Further, since the hook 43 rotates inside the box-like unit 1 and catches the engaging rod 3a, an improved viewing property is provided for the worker who stands at the rear side of the box-like unit 1 and is convenient for executing a safety confirmation of operating conditions.

Next, the worker operates the handle 44 from a condition shown in FIG. 12B and further rotates it to a condition shown in FIG. 12C in a direction as shown by an arrow R3 by approximately 95 degrees. When this takes place, the lock portions 44f, 44f of the handle 44 slide along an inclination of the tapered part 45a and are inserted to an engaging portion 45b (see FIG. 11) for engagement therewith.

That is, as shown in FIGS. 10 and 11, the stopper 45 is mounted to the body frame 41 via the rotational shaft 45c for rotational movement and is urged with the spring 45d, connected between the body frame 41 and the stopper 45, in a direction opposite the direction of an arrow R4 shown in FIG. 12C. The stopper 45 forming a stopper portion serves to lock the handle 44 and to unlock the same from the locked condition. Under a condition where the lock portions 44f, 44f of the handle 44 are caught and locked against the force of the spring 45d, as shown in FIG. 12C, the fixing pin 42 assumes the rightmost position of the guide bore 43a to cause the pin 44b to rotate counterclockwise from a vertical direction with an inclination of approximately 5 degrees and to be stopped in such a position. That is, under the condition shown in FIG. 12C, since the handle 45 is locked with the stopper 45 and, in addition thereto, the springs 43c, 44d and the weight per se of the lower box-like unit 1, suspended from the upper display unit 1, tend to rotate the handle 43 in the direction as shown by the arrow R3, the handle 44 is reliably stabled in the locked condition.

With such structures of the unit connecting mechanism and the image display device set forth above, simply operating the handle 44 by the worker enables the series of coupling and fixing operations to be smoothly and appropriately performed in the first to third coupling operations of (i) receiving the connecting pin 3 of the lower box-like unit 1, (ii) catching the connecting pin 3 and (iii) fixing the caught connecting pin 3.

The unlocking operation of the connected upper and lower box-like units 1, 1 is achieved in a sequence opposite to that of the locking (coupling) operation set forth above.

That is, the worker initially grips the grip portion 45e of the stopper 45 and then pulls down the stopper 45 in the direction of arrow R4 as shown in FIG. 12C against the force of the spring 45d.

As such, the lock portions 44f, 44f of the handle 44 moves upwardly along an edge of the engaging portion 45b of the stopper 45 to escape from the engaging portion 45b. Consecutively, the worker operates to grip and to rotate the grip portion 44c of the handle 44 in a direction (clockwise direction) opposite to the arrow R3 against the tension forces of the springs 43c, 44d with the handle 44 being returned to a positional condition shown in FIG. 12A via a position of FIG. 12B.

Figure 13:
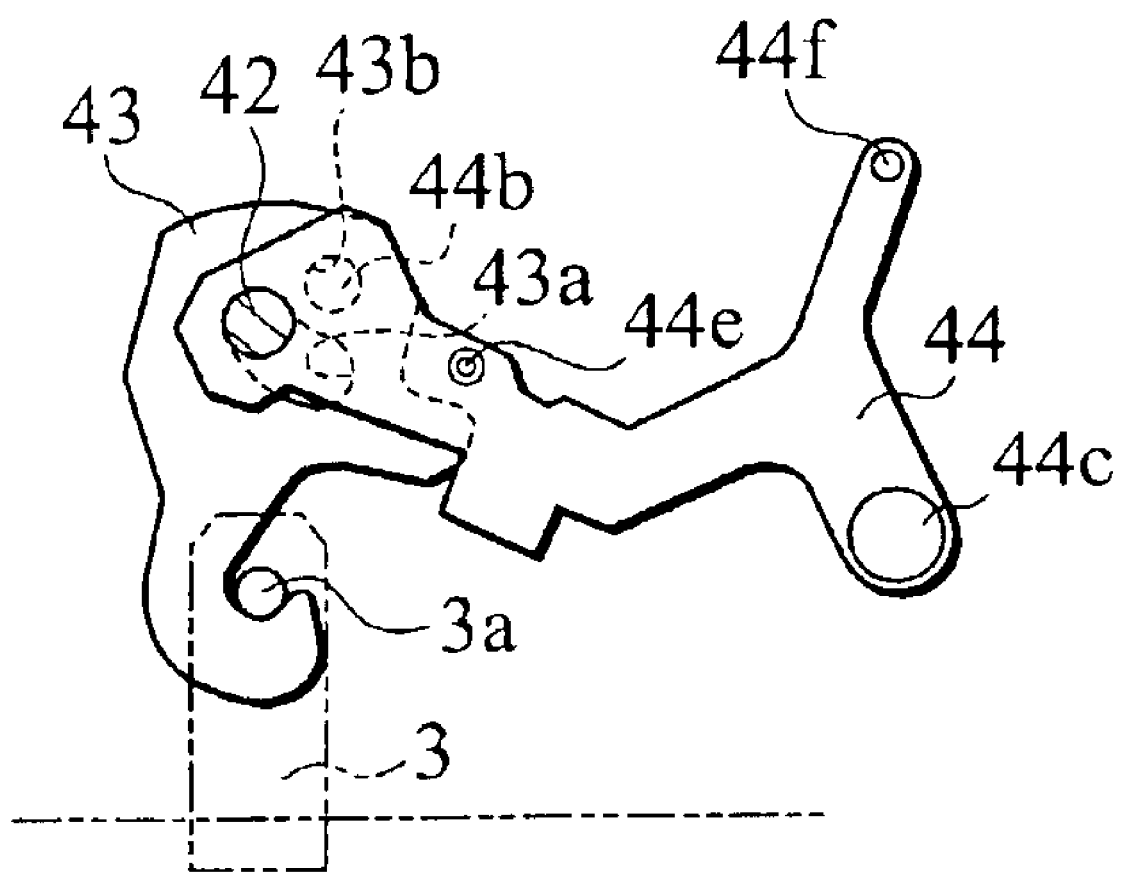
FIG. 13 is a view for illustrating the operation of the unit connecting mechanism in consecutive relation to FIGS. 12A to 12C and for illustrating a coupled status with a lower box-like unit suspended from an upper box-like unit.

In a normal practice, although there is no provability of carrying out the disassembling (uncoupling) work of the upper and lower box-like units 1, 1 with the lower box-like unit 1 remaining under a suspended condition, even if the lower box-like unit 1 tends to drop under a condition wherein the handle 44 and the hook 43 assumes the respective positions between the position of FIG. 12B and the position of FIG. 12C, the handle 44 and the hook 43 are stable under the condition shown in FIG. 13 with no provability of the engaging rod 3a from escaping the hook 43.

That is, under the condition where the lock portions 44f, 44f of the handle 44 are retained with the upper stopper 45, even if the lock portions 44f, 44f disengages from the stopper 45 due to erroneous operation of the worker and, also, the handle 44 is caused to inevitably rotate in the direction (counterclockwise direction) opposite to the arrow R3 of FIG. 12C, the lower box-like unit 1 is prevented from dropping to preclude the lower box-like unit 1 from being damaged while ensuring a safety of the worker.

Accordingly, under the condition shown in FIG. 13, in the first place after the worker confirms a condition in which the lower box-like unit 1 is surely placed on the ground, the worker applies a force to move the handle 44 further downwardly to cause the handle 44 to assumes the condition shown in FIG. 12A, with a resultant capability for the upper and lower box-like units 1, 1 to be reliably and safely uncoupled from one another.

While, in the foregoing description, the engaging rod 3a has been stated as the entirely bar shape member, the engaging rod 3a may be entirely formed in a ring shape or U-shape configuration, or the hook may be formed with a partially bar shape portion with which the engaging rod 3a engages.

From the foregoing description, it appears that, according to the embodiment of the present invention, it is possible for the worker to perform a series of consecutive operations for achieving the coupling and uncoupling operations of the upper and lower box-like units 1, 1 in a highly safety and reliable manner.

Now, the adjustor 46 provided to the unit connecting mechanism set forth above is described below.

As previously noted above, in order for the image display device to provide the image display in a high quality, it is required for the upper and lower box-like units 1, 1 to have an appropriate gap, i.e., a reduced joint area. On the other hand, there is a need for a distance, i.e., a connecting stroke length, between the hook 43 and the engaging rod 3a required when coupling the upper and lower box-like units 1, 1 to have a distance and space that enables the upper and lower box-like units 1, 1 to be coupled through the operation of the handle 44.

To this end, the adjustor 46 adopts a so-called feed screw mechanism which is structured to enable the height position of the fixing pin 42, fixed to the through bore 46a, to be controllably adjusted such that the upper and lower box-like units 1, 1 are coupled to one another while, at the same time, the appropriate joint is obtained between the upper and lower box-like units 1, 1 in their assembled states.

More particularly, as shown in FIGS. 10 and 11, the adjustor 46 is fixedly mounted in the vertical direction with respect to the body frame 41 to allow the fixing pin 42 to move upwardly or downwardly to assume an adjusted height position within the operating apertures 41a, 41a of the body frame 41 owing to the worker's rotational operation of a knob 46b. Consequently, it is possible for the worker to control the fixing pins 42 at adjusted height positions individually depending on manufacturing mechanical errors in dimension of the respective box-like units 1, 1 to be stacked in the vertical direction by the worker, providing a capability of smooth coupling operation while attaining the appropriate amount of joint between the adjacent box-like units 1, 1 to obtain the display image of a high quality. Also, in FIGS. 10 and 11, reference numeral 46c designates a spring for fixing the knob 46c in a semi-fixed state.

From the foregoing description, according to the embodiment of the present invention, since the unit connecting mechanism has a structure in which the stopper 45 is located in the upward area to allow the handle 44 to rotate upwardly so as to describe an arc during coupling operation of the upper and lower box-like units 1, 1 and, subsequently, the handle 44 is brought into the locked position in an upwardly folded condition, the unit connecting mechanism tends to have a compact structure with a reduced depth for thereby realizing the box-like unit 1 with a space-saving property.

Further, since the adjustor 46 is structured to align a rotational axis of the knob portion 46b in the vertical direction, it becomes easy for the worker to insert his hand from the rear side of the box-like unit 1 to perform adjustment operation, resulting in an improvement in a workability while achieving the assembling work of the image display device at a high efficiency.

While, in the foregoing description, the description has been given to the coupling operation for the upper and lower box-like units 1, 1 through the use of the connecting mechanism, such a coupling operation is initiated after the upper box-like unit 1 is positioned with respect to the lower box-like unit 1 while guiding the upper box-like unit 1 along the guide pins 173, 173 of the lower display unit 1.

Figure 14A:
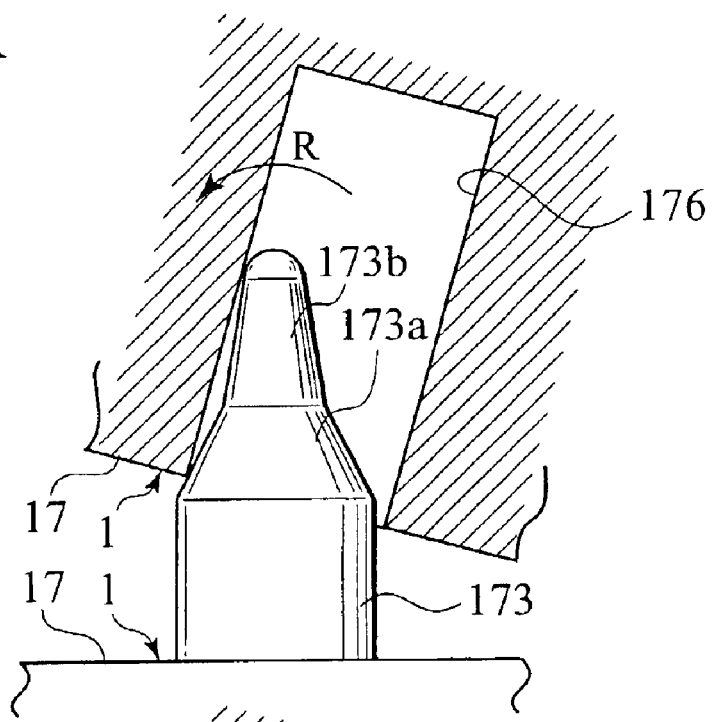
FIGS. 14A and 14B are views for illustrating a positional relationship between a guide pin and an associated engagement bore to guide the guide pin shown in FIG. 7.
Figure 14B:
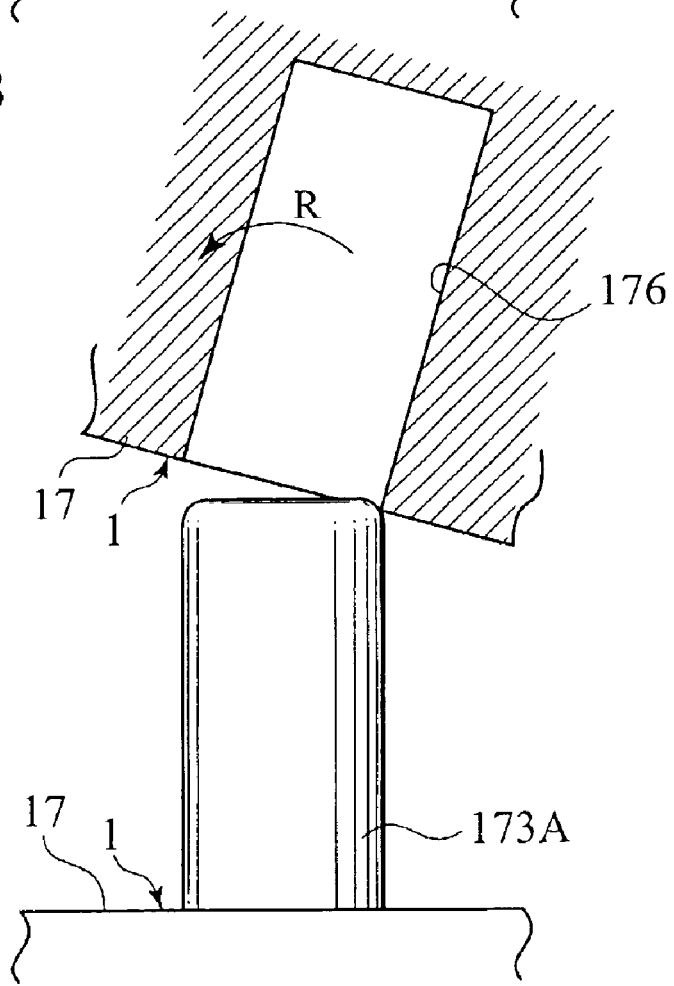

To this end, the guide pin 173 of the presently filed embodiment is formed in an entirely circular shape in a cross section and, as shown in FIG. 14A in an enlarged scale, the guide pin 173 includes a base shaft portion extending upright from the chassis, a stepped tapered portion 173a contiguous with the base shaft portion and a small diameter inserting portion 173b, contiguous with the stepped tapered portion 173a, that extends toward a distal end.

As shown in FIG. 14A, as a consequence, when the upper box-like unit 1 is stacked on the lower box-like unit 1 with the upper box-like unit 1 remaining in a slightly inclined state, even in the presence of more or less displacement between an orientation of the lower guide pin 173 and an associated engagement bore 176 of the associated (upper) box-like unit 1, the small diameter inserting portion 173b of the can be easily brought into engagement with the engaging bore 176.

Further, once the upper and lower box-like units 1, 1 have been mated with one another, since a lower opening portion of the engaging bore 176 is brought into contact with the stepped tapered portion 173a to smoothly move downwardly along an inclined wall thereof, an attitude of the upper box-like unit 1 is corrected for thereby causing the engaging bore 176 to be guided with the guide pin 173 to be smoothly brought into engagement with respect to one another.

Thus, the guide pin 173 forming the embodiment of the present invention includes the stepped tapered portion 173a and the small diameter inserting portion 173b. On the contrary, with a guide pin 173A with no stepped tapered portion and the associated small diameter portion, a lower end of the engaging bore 176, that engages the guide pin 173A of the upper box-like unit 1, happens to abut a head of the guide pin 173A to be halted there, resulting in a damage caused in the lower end opening portion of the engaging bore 176 or the guide pin 173A.

Next, a structure and operation of a unit connecting mechanism of the embodiment of the present invention to couple the box-like units 1, 1 in a lateral direction are described below.

As shown in FIG. 15, the unit connecting mechanism includes two sets of second coupling members 5, 5, with each set of second coupling members including a hook portion 51 and an engaging portion 52 that form a hook coupling. The two set of coupling members 5, 5 are separated from one another with a distance D in a vertical direction and with a distance d in a rearward (depth) direction. In particular, the hook portion 51 and the engaging portion are mounted in an upper and lower inward areas of the side wall of one of the box-like unit 1. Likewise, the engaging portion 52, that forms the hook coupling with the associated hook portion 52 of the one of the box-like unit 1, and the hook portion 51, that forms the hook coupling with the associated engaging portion 52 of the one of the box-like unit 1 are mounted in upper and lower inward areas of the side wall of the other one of the box-like unit 1.

Figure 16:
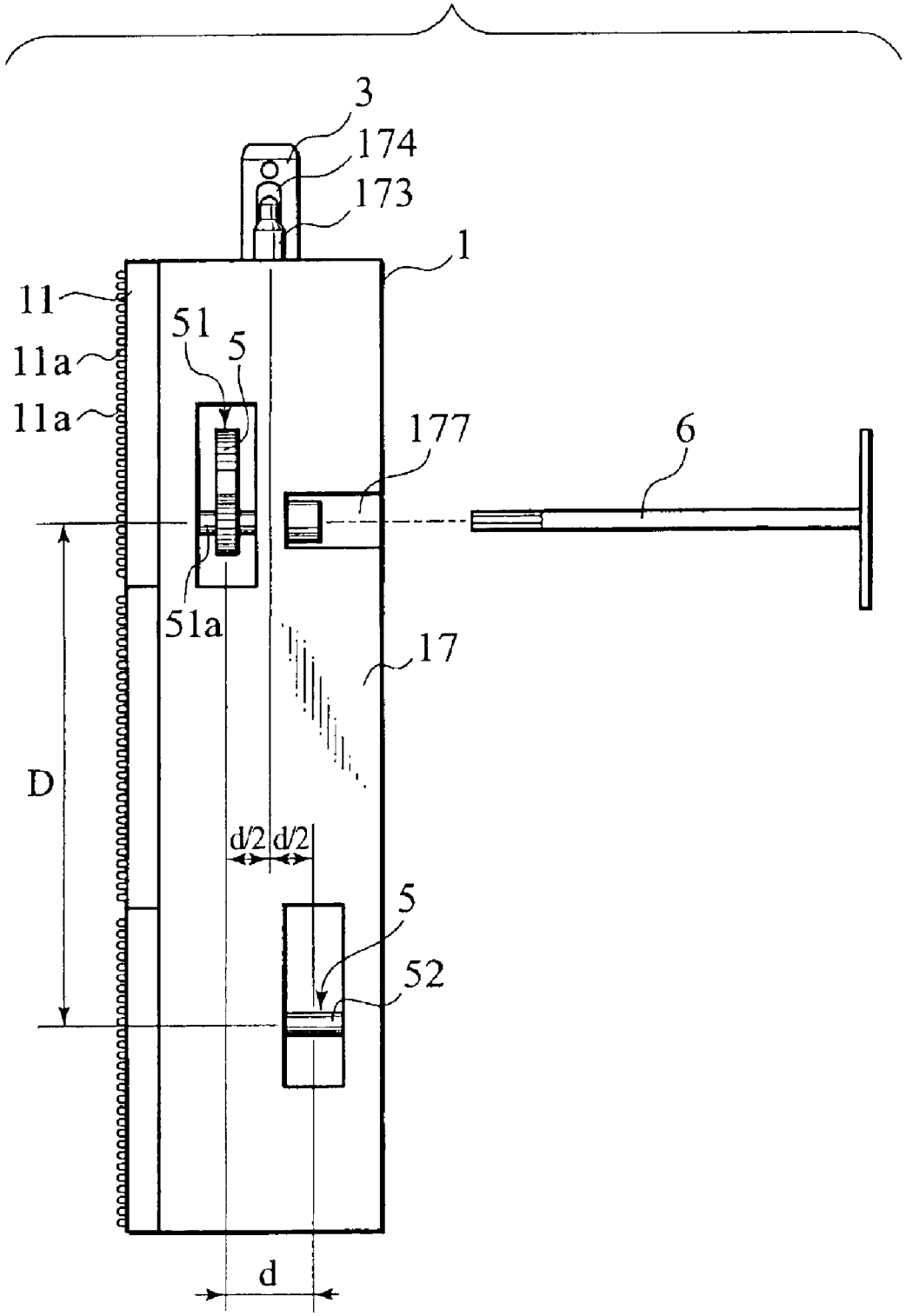
FIG. 16 is a side view as viewed in a direction of arrow XVI—XVI of FIG. 15.

FIG. 16 is a side view as viewed in a direction as shown by an arrow XVI—XVI and shows the hook portion 51 and the engaging portion 52, mounted to the side wall of the one of the box-like units 1, 1, forming parts of two set of second coupling members 5, 5, respectively for the sake of convenience of description.

As shown in FIG. 16, the connecting pin 3 stands upright from the chassis 17 of the box-like unit 1 at a position aligned on a vertical line intersecting substantially centers of gravity of the respective box-like units 1, 1 to permit the upper and lower box-like units 1, 1 to be stacked and lifted up in respective stabled attitude and positions in installed statuses. Further, the coupling members 5, 5 of one set are disposed at both sides of the vertical line passing across the center of gravity with an equal distance of (d/2) in fore and aft (depth) direction with respect to the vertical line.

Figure 17:
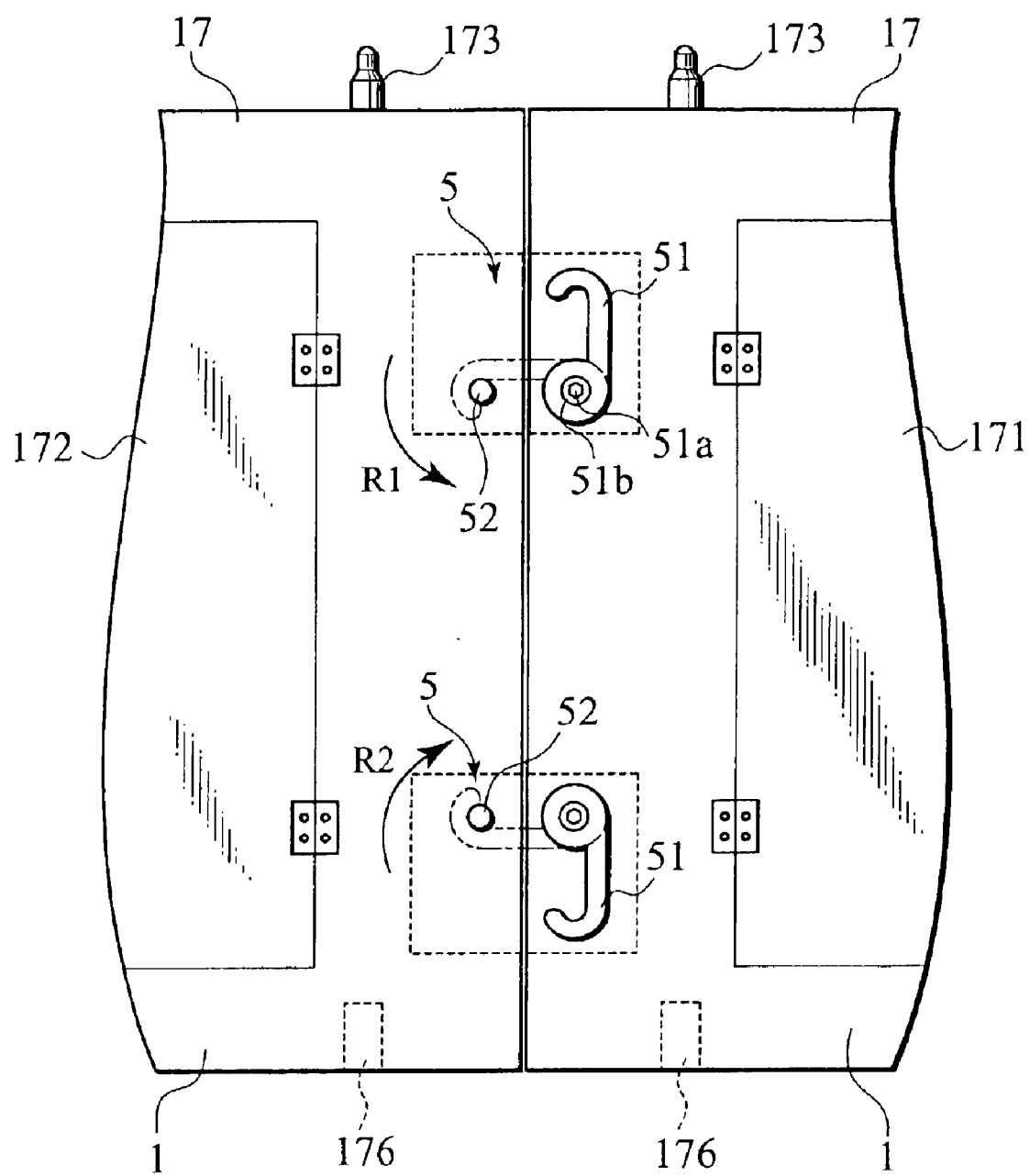
FIG. 17 is a rear view for illustrating the box-like units, shown in FIG. 15, coupled in a lateral direction.

Further, FIG. 17 shows rear sides of the unit connecting mechanisms of the right and left box-like units 1, 1 held in a coupled state. Each of the coupling members 5, 5 is structure to have a hook-like coupling that includes a hook portion 51 forming a movable element and an engaging portion 52 adapted to engage the hook portion 51 like in the related art connecting segment 2 shown in FIGS. 1 to 6. And, the hook portion 51 and the engaging portion 52 are disposed on the opposing side walls of the box-like units 1, 1 at inward areas of the respective chassis 17, 17.

As shown in FIGS. 15 to 17, the hook portion 51 is mounted in the chassis 17 for free rotational movement about a center of a rotational shaft 51a, with a distal end surface of a rear side of the rotational axis 51a being formed with a hexagonal bore 51b. The hexagonal bore 51b is exposed to the rear side of the display unit 1 via an opening aperture 177 formed in the chassis 17.

Accordingly, implementing operation to insert a hexagonal wrench 6 through the opening aperture 177 and to fit the same into the hexagonal bore 51b of the rotational shaft 51a enables the hook portion 51 to engage the associated engaging portion 52 of the other box-like unit 1 and to disengage from the associated engaging portion 52.

In such a way, since the end face of the rotational shaft 51a of the hook portion 51 forming an operating point of each of the coupling members 5, 5 is arranged to be exposed to the rear side of the box-like unit 1, it is possible for the worker to couple or uncouple the box-like units 1, 1 in a easy and reliable manner.

Further, according to this embodiment, the unit connecting mechanism comprised of the two sets of coupling members 5, 5 are arranged to extend in the depth direction with respective distances of d, d, respectively, it is possible for the adjacent box-like units 1, 1 to be stabilized in terms of rotational displacement about the axis in the vertical direction, with a resulting capability of preventing the assembled image display device from being distorted due to vibrations and wind pressures or from being inclined.

Furthermore, according to this embodiment, since the respective hook portions 51, 51 of the two sets of connecting segments are arranged to be rotational to be brought into coupling and uncoupling conditions in opposite directions as shown by arrows R1, R2 in FIG. 17, even when the adjacent box-like units 1, 1 are exerted with external forces to be displaced from one another due to some reasons, the hook portions 51, 51 are effective to avoid such unfavorable displacement, resulting in the image display device which is stable in structure.

Also, while, in the foregoing description, the present invention has been described with the embodiment wherein the worker inserts the hexagonal wrench into the hexagonal bore to operate the coupling members 5, 5, in a word, the coupling members 5, 5 may be operated with some expedients. For example, the rotational shaft 51a may have a configuration to be operated with a Phillips-head screwdriver or a minus-head screwdriver to be brought into the coupling and uncoupling conditions.

In anyway, according to the embodiment, two sets of coupling members 5, 5 include combinations of hinged hook portions 51, 51 and the engaging portions 52, 52 engaging the respective distal ends of the rotated hook portions 51, 51, with the end faces of the rotational shafts 51a of the hook portions 51 being exposed to the respective rear wall sides of the right and left box-like units 1, 1. As a result, it is possible for the worker to perform the coupling and uncoupling operations of the right ad left box-like units 1, 1 in an easy fashion.

Figure 18:
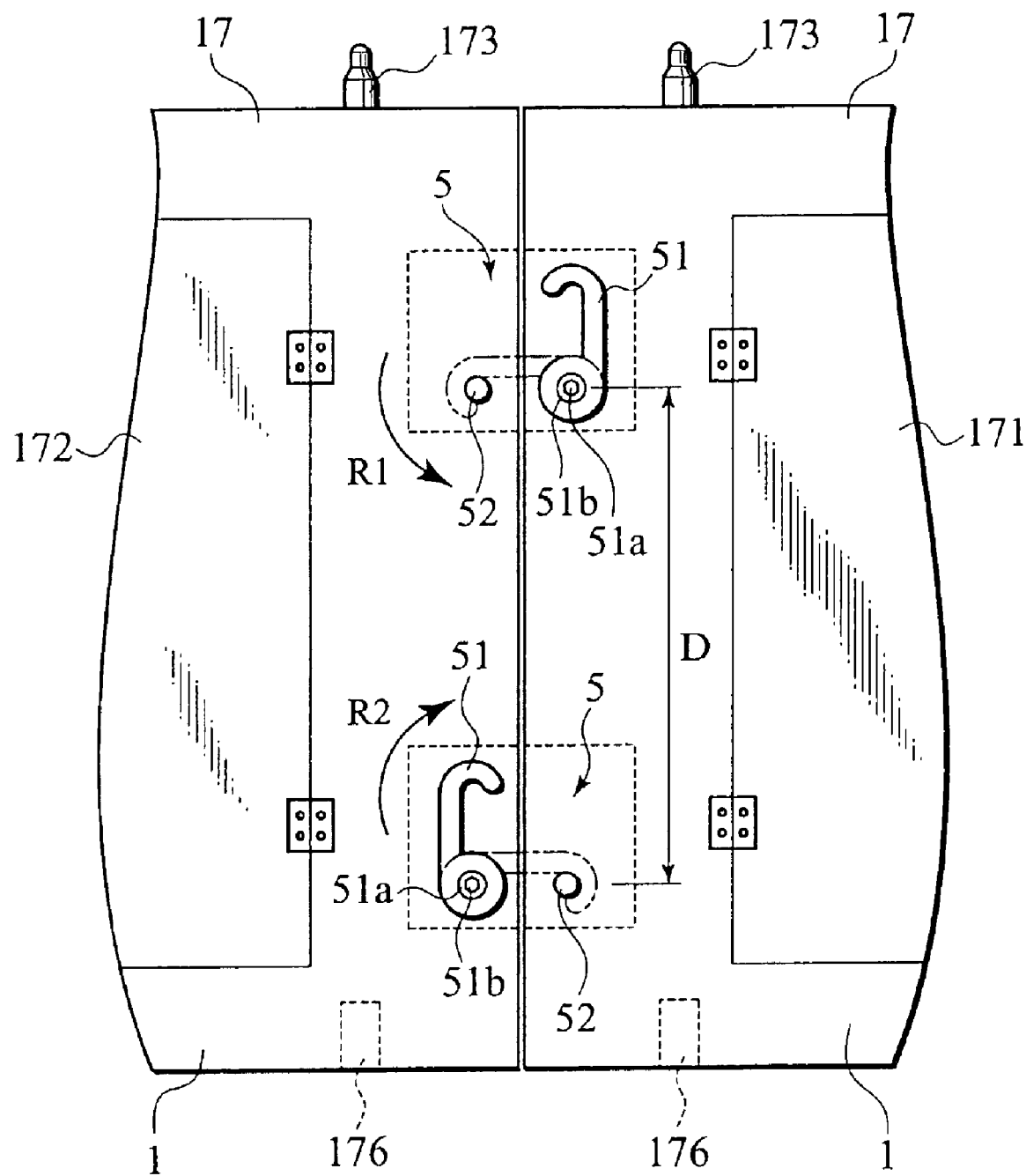
FIG. 18 is a rear view for illustrating the box-like units coupled in the lateral direction via a unit connecting mechanism of a modified form of the image display unit of the first embodiment according to the present invention.

FIG. 18 is a view illustrating an image display device of a modified form of the embodiment according to the present invention, which differs from the embodiment shown in FIGS. 7 to 17 in that a unit connecting mechanism includes two set of connecting segments 5, 5 disposed on the adjacent box-like units 1, 1 in a mounting pattern different from that the coupling members 5, 5 of the presently filed embodiment.

That is, with the modified form, as shown in a rear view of FIG. 18 in correspondence with FIG. 17, the unit connecting mechanism includes the coupling members 5, 5 located between the adjacent box-like units 1, 1, with each of the box-like units 1, 1 having the hook portion 51 and the engaging portion 52 mounted to the respective chassis 17. With such a structure, it is possible to obtain the same result as that obtained in the image display device of the embodiment shown in FIGS. 7 to 17.

According to the unit connecting mechanism and the image display device using such unit connecting mechanism, it is possible for the worker to perform the coupling operation of the upper and lower display units in an easy and appropriate fashion through consecutive steps of upward rotational operation of the grip portion of the handle, while, at the same time, enabling the worker to perform the uncoupling operation in a smooth and proper fashion through the downward rotational operation of the stopper portion.

In addition, according to the present invention, since the unit connecting mechanism has the structure in which the upwardly rotated grip portion is retained with the lock portion, the unit connecting mechanism is able to be structured in a compact structure in the depth direction to preclude the grip portion from escaping outside the display unit to realize a space-saving characteristic of the display unit.

Second Embodiment

Figure 20:
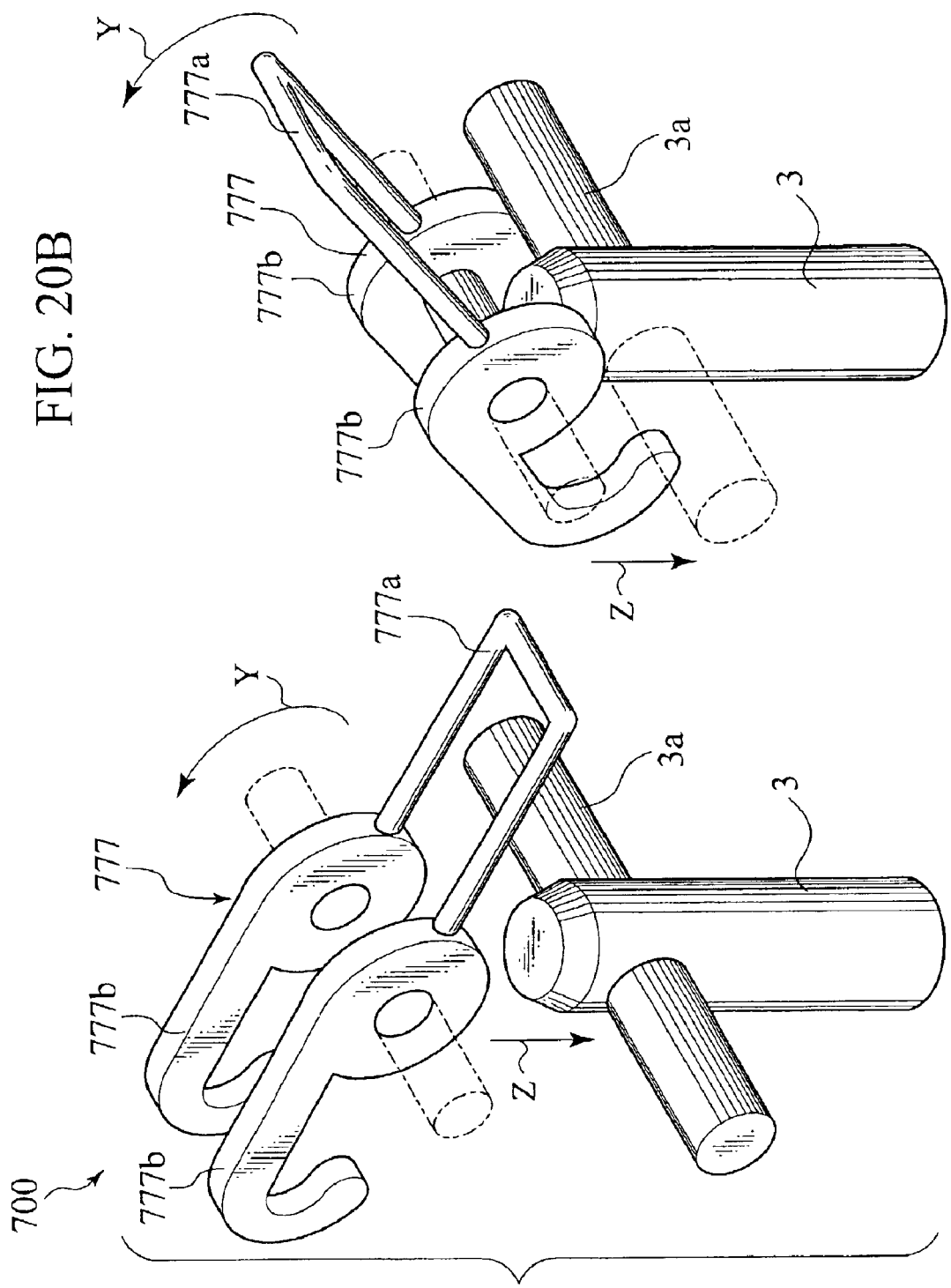
FIGS. 20A and 20B are views for illustrating a coupling operation between a connecting pin, shown FIG. 19, and an engaging unit that catches the connecting pin to couple the upper and lower box-like units.
Figure 21:
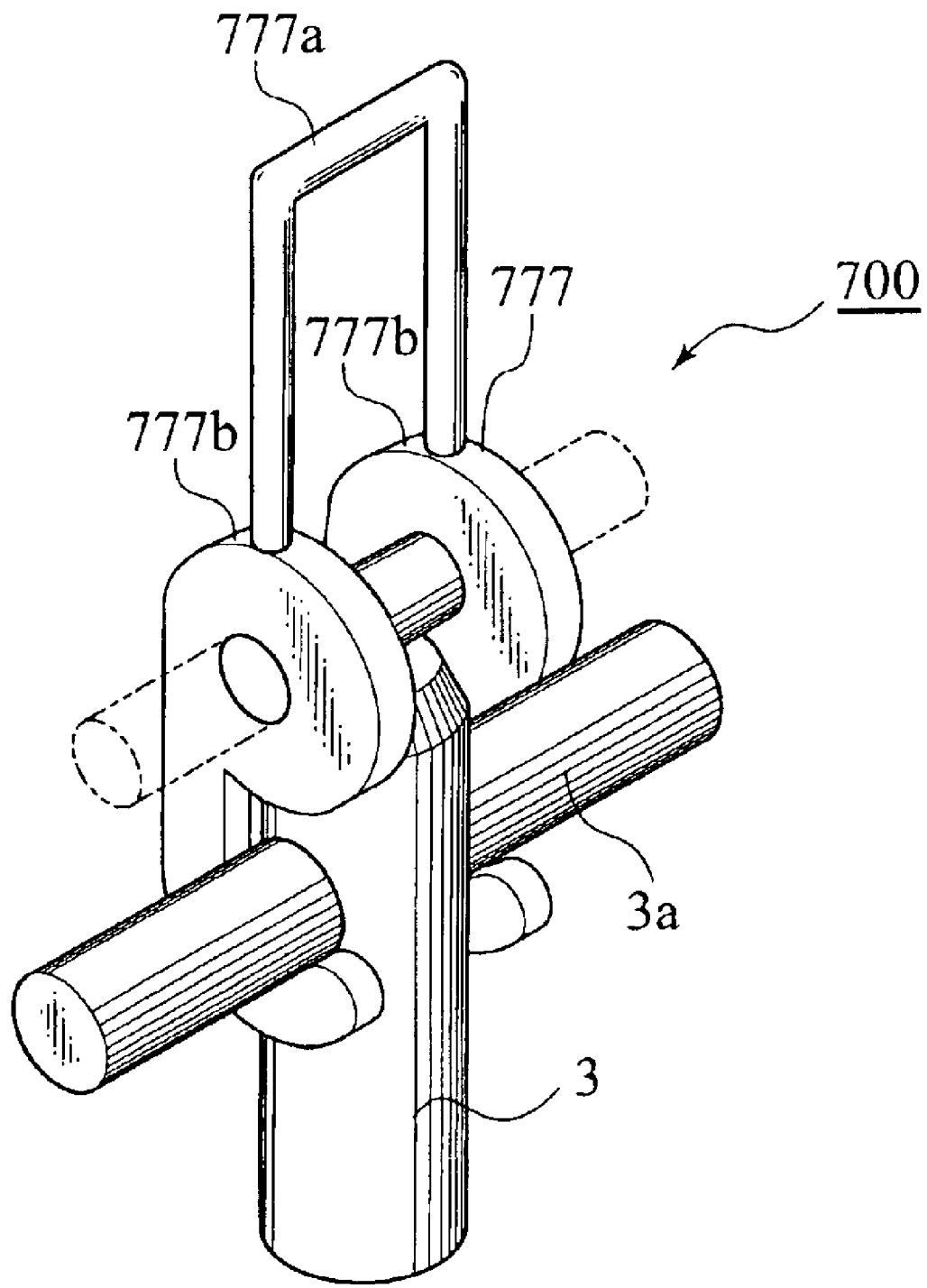
FIG. 21 is a view for illustrating the operation of the connecting pin, shown in FIGS. 20A and 20B, and the engaging unit to catch the connecting pin in a coupled condition.

Referring to FIGS. 20A to 21, a connecting mechanism of a second embodiment of the present invention is described. In the second embodiment, the unit connecting mechanism includes an engaging section 700, which serves to fix upper and lower box-like units 1', 1' with respect to one another, with a structure different from that of the first embodiment. Accordingly, other parts are substantially the same as those of the first embodiment and, so, like parts bear the same reference numerals as those of the first embodiment to omit redundant description.

Figure 19:
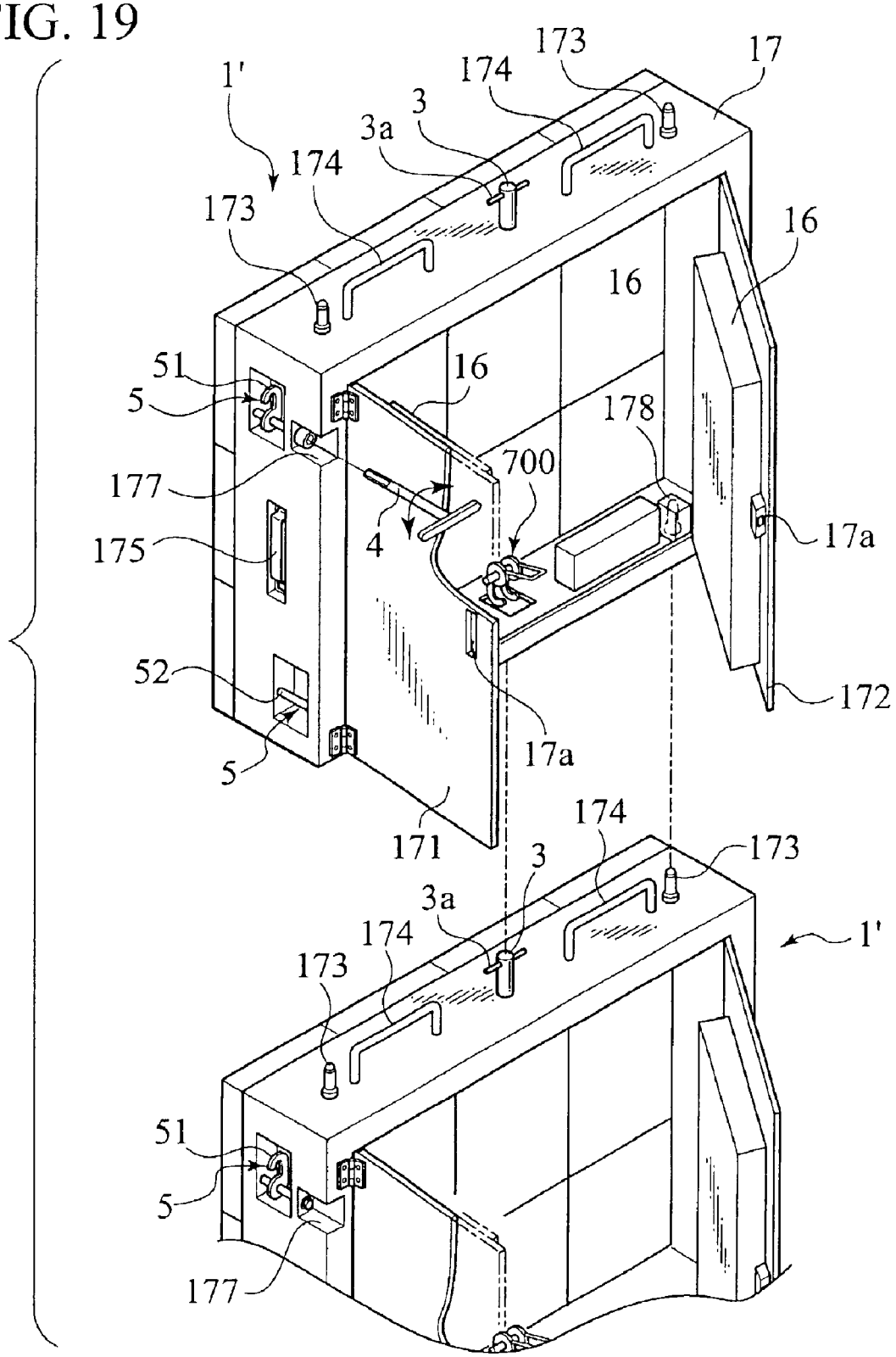
FIG. 19 is a perspective view of an image display device composed of box-like units incorporating a unit connecting mechanism of a second embodiment according to the present invention.

FIG. 19 is a perspective view of a box-like unit 1' of the second embodiment as viewed from a rear side thereof.

Also, FIGS. 20A, 20B and 21 are views illustrating how an engaging rod 3a of a connecting pin 3 is caught with an associated engaging member 777.

That is, as shown in FIG. 20A, prior to catching the engaging rod 3a with the engaging member 777, the upper box-like unit 1' is stacked in such a way to be positioned while the upper box-like unit 1' is guided along guide pins 173, 173 of the lower box-like unit 1'.

When this takes place, as shown in FIG. 20A, the engaging member 777 of the upper box-like unit 1' remains in an opened status. The unit connecting mechanism is structured such that, subsequently, as shown in FIG. 20B, the worker operates to rotate an arm 777a in a direction as shown by an arrow Y to cause a pair of engaging segments 777b, 777b of the engaging member 777 to catch the engaging rod 3a as viewed in FIG. 21 for thereby bringing the upper and lower box-like units 1', 1' into a fixedly coupled state.

With such a structure of the second embodiment, since the upper and lower box-like units 1', 1' have the same structures as those of the first embodiment except for the engaging member 777 set forth above, the second embodiment is able to enjoy the same advantage as that of the first embodiment.

While, in the foregoing description, specific embodiments of the invention have been described in detail, it will be appreciated to those skilled in the art that various modifications and alternatives to those details could be developed in light of the overall teachings of the disclosure.

What is claimed is:

1. A unit connecting mechanism adapted to be mounted between plural box shaped units to cause the plural box shaped units to be coupled to and uncoupled from one another, the unit connecting mechanism comprising:

a first coupling member operative to couple the box shaped units in a vertical direction; and two sets of second coupling members disposed at side walls of the box shaped units at inward areas thereof, respectively, to cause the box shaped units to be coupled in a lateral direction; wherein the first coupling member includes a connecting pin standing upright from an upper end of a lower one of the box shaped units coupled together in the vertical direction and having an engaging rod laterally extending from the connecting pin, a hook portion mounted in a lower area of an upper one of the box shaped units coupled together in the vertical direction and supported on a laterally extending shaft for rotational movement, a grip portion operatively connected to the hook portion and operative to rotate upwardly to cause the hook portion to catch the engaging rod to which the hook portion comes closer, and an engaging section including a stopper operative to lock the grip portion, which rotates upwardly, and to release the grip portion due to downward operation thereof; and wherein the two sets of the second coupling members are disposed on the side walls of the box shaped unit to be separated from one another in the vertical direction and in a rearward direction and each has an operating point exposed to a rear side of the box shaped units to allow each set of the second coupling members to be operated in a coupled condition or in an uncoupled condition.

2. The unit connecting mechanism according to claim 1, wherein:

each of the box shaped units includes a display device having a surface arrayed with a large number of display elements.

3. The unit connecting mechanism according to claim 1, wherein:

the hook portion is structured to rotate within an area inside the upper one of the box shaped units to catch the engaging rod.

4. The unit connecting mechanism according to claim 1, wherein:

the grip portion is structured to rotate while sliding along a body frame of the upper one of the box shaped units.

5. The unit connecting mechanism according to claim 1, further comprising:

an adjustor mounted to the lower area of the upper one of the box shaped units and operative to adjust a height position of the hook portion.

6. The unit connecting mechanism according to claim 5, wherein:

the adjustor includes a feed screw mechanism having a rotational axis oriented in the vertical direction.

7. The unit connecting mechanism according to claim 1, wherein:

each set of the second coupling members includes a hook coupling.

8. The unit connecting mechanism according to claim 7, wherein:

the hook coupling includes a hinged hook portion and an engaging portion which a distal end of the hinged hook portion engages; and wherein the hinged hook portion has a rotational shaft having an end face thereof exposed to the rear side of the box shaped units.

9. The unit connecting mechanism according to claim 1, wherein:

the hinged hook portion of one set of the second coupling members and the hinged hook portion of the other set of the second coupling members are operative to rotate in opposite directions with respect to each other to allow the two sets of the second coupling members to be coupled or uncoupled.

10. The unit connecting mechanism according to claim 1, wherein:

each of the box shaped units has a guide pin standing upright from an upper surface of the box shaped units, and an engagement bore formed at a bottom wall of the box shaped units in correspondence to the guide pin.

11. The unit connecting mechanism according to claim 10, wherein:

the guide pin is formed in a circular shape in a cross section and includes a base shaft portion, a stepped tapered portion contiguous with the base shaft portion and a small diameter inserting portion contiguous with the stepped tapered portion.

* * * * *